United States Patent [19]

Borrelli

[11] 4,070,565

[45] Jan. 24, 1978

[54] PROGRAMMABLE TESTER METHOD AND APPARATUS

[75] Inventor: Ronald N. Borrelli, Moraga, Calif.

[73] Assignee: Zehntel, Inc., Concord, Calif.

[21] Appl. No.: 715,232

[22] Filed: Aug. 18, 1976

[51] Int. Cl.² .................. G06F 11/04; G01R 31/28
[52] U.S. Cl. ................................. 235/302; 364/490;
    364/580; 324/73 R
[58] Field of Search ............... 235/153 AC, 151.31;
    324/73 R, 73 AT

[56] References Cited

U.S. PATENT DOCUMENTS

| | | | |
|---|---|---|---|
| 3,631,229 | 12/1971 | Bens et al. | 324/73 R X |
| 3,764,995 | 10/1973 | Helf, Jr. | 235/151.31 X |
| 3,931,506 | 1/1976 | Borrelli et al. | 235/153 AC |
| 4,000,460 | 12/1976 | Kadakia et al. | 324/73 R |

*Primary Examiner*—Jerry Smith

*Attorney, Agent, or Firm*—Flehr, Hohbach, Test, Albritton & Herbert

[57] ABSTRACT

A method and apparatus for automatic, programmed, in-circuit testing of individual logic elements. A plurality of program-operated device connection switches are provided for making connections to the circuit under test. A plurality of program-operated drive circuits are provided for driving nodes of the logic element under test with controlled current, voltage and power to logical 1, logical 0, or a high impedance state. A measurement unit measures an output from the logic element under test. Testing programs are run in a program-controlled processor. The programs have subroutines which correlate with individual types of logic elements. Each logic element is examined, in circuit, independently of neighboring logic elements. A translation memory stores data for translating node addresses to facilitate topology independent subroutine processing of identical elements.

23 Claims, 8 Drawing Figures

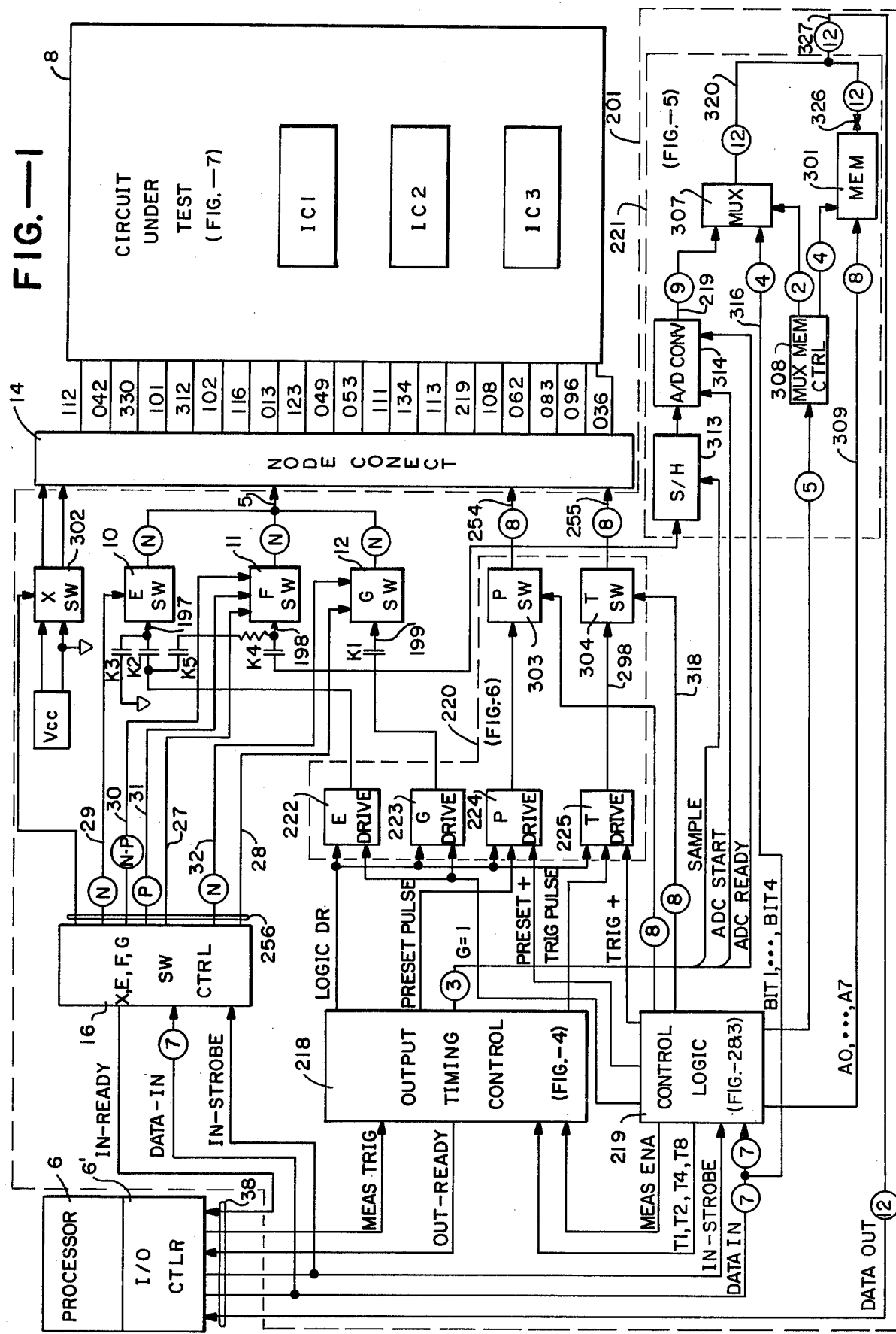

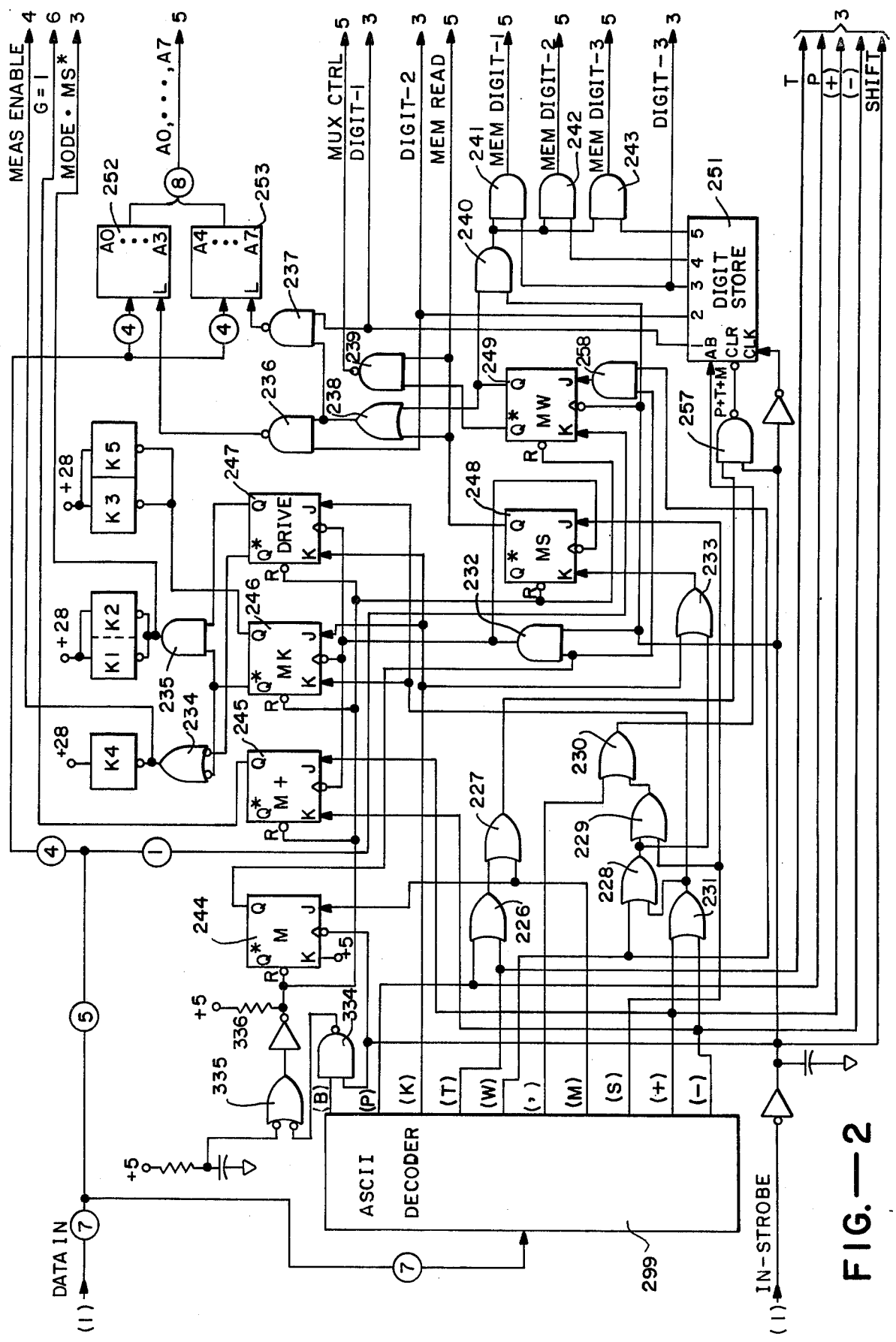
FIG.—2

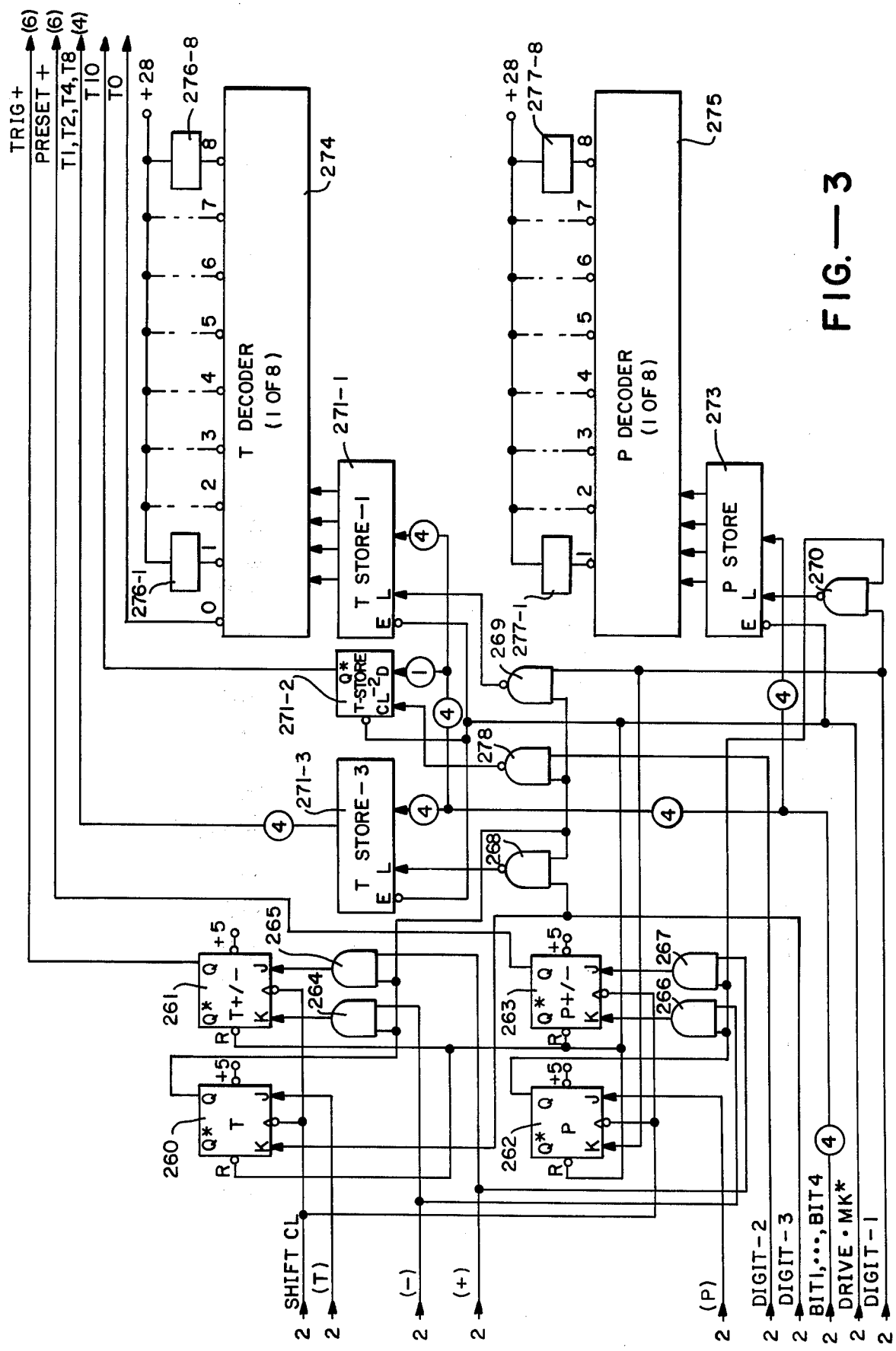
FIG.—3

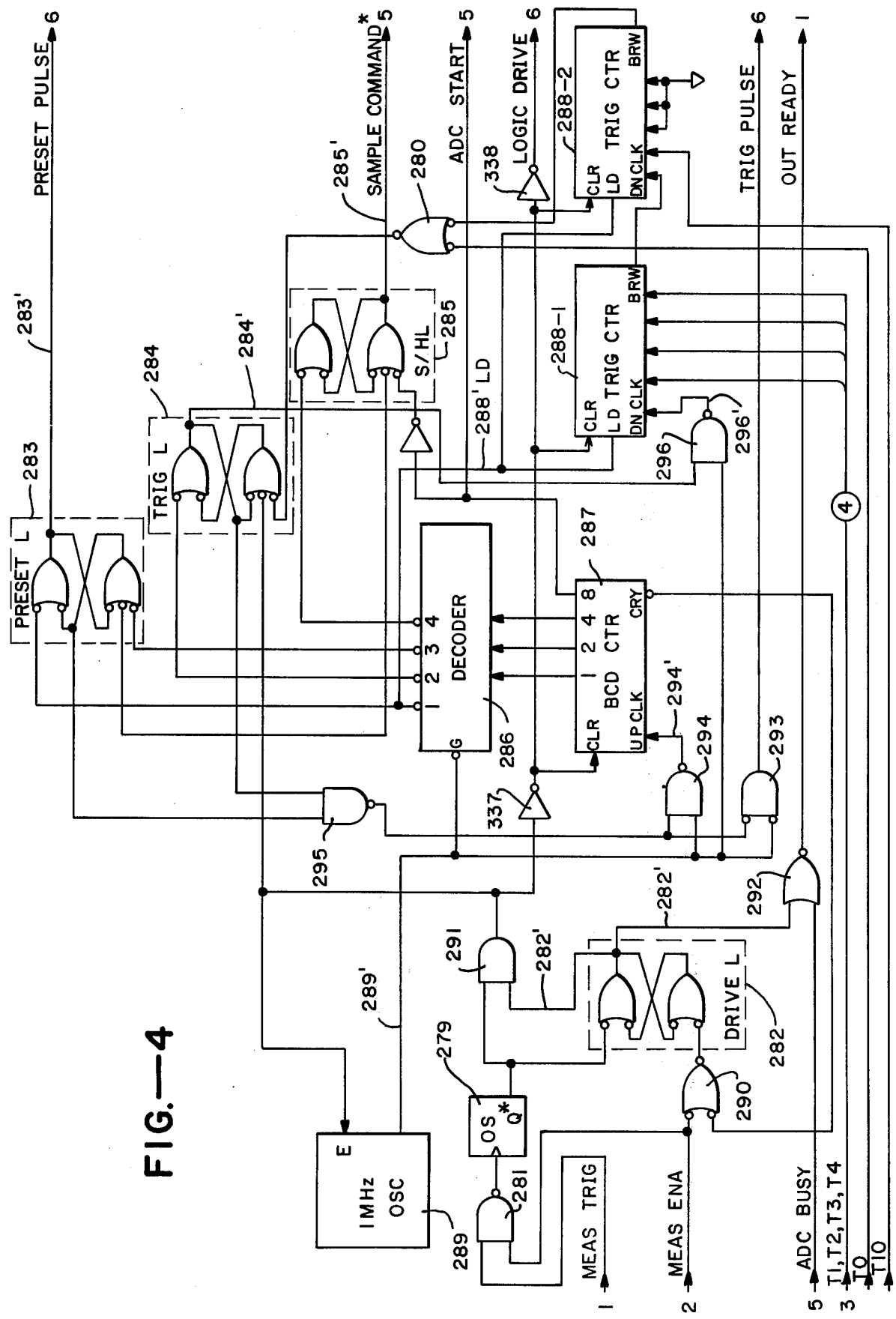
FIG.—4

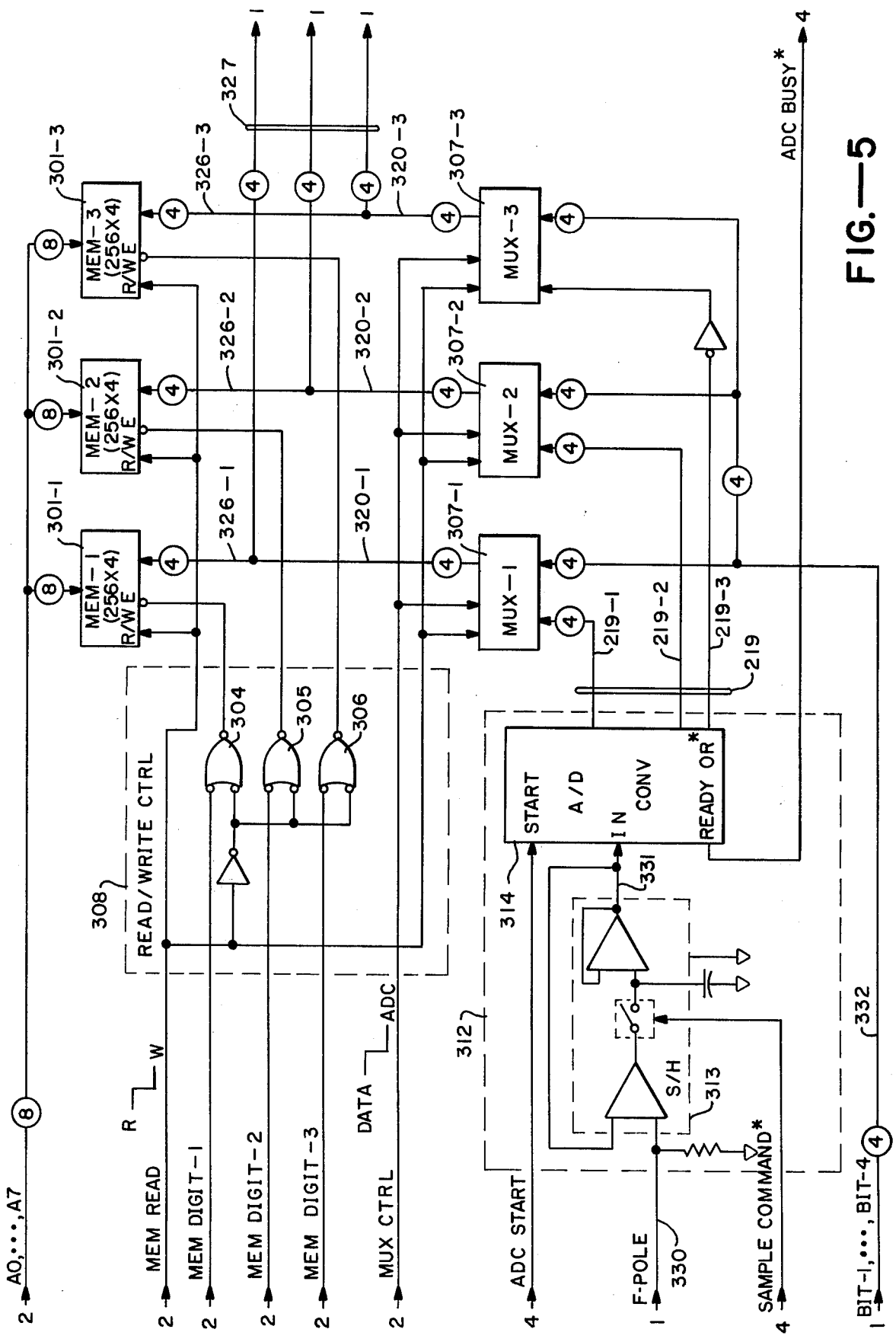
FIG.—5

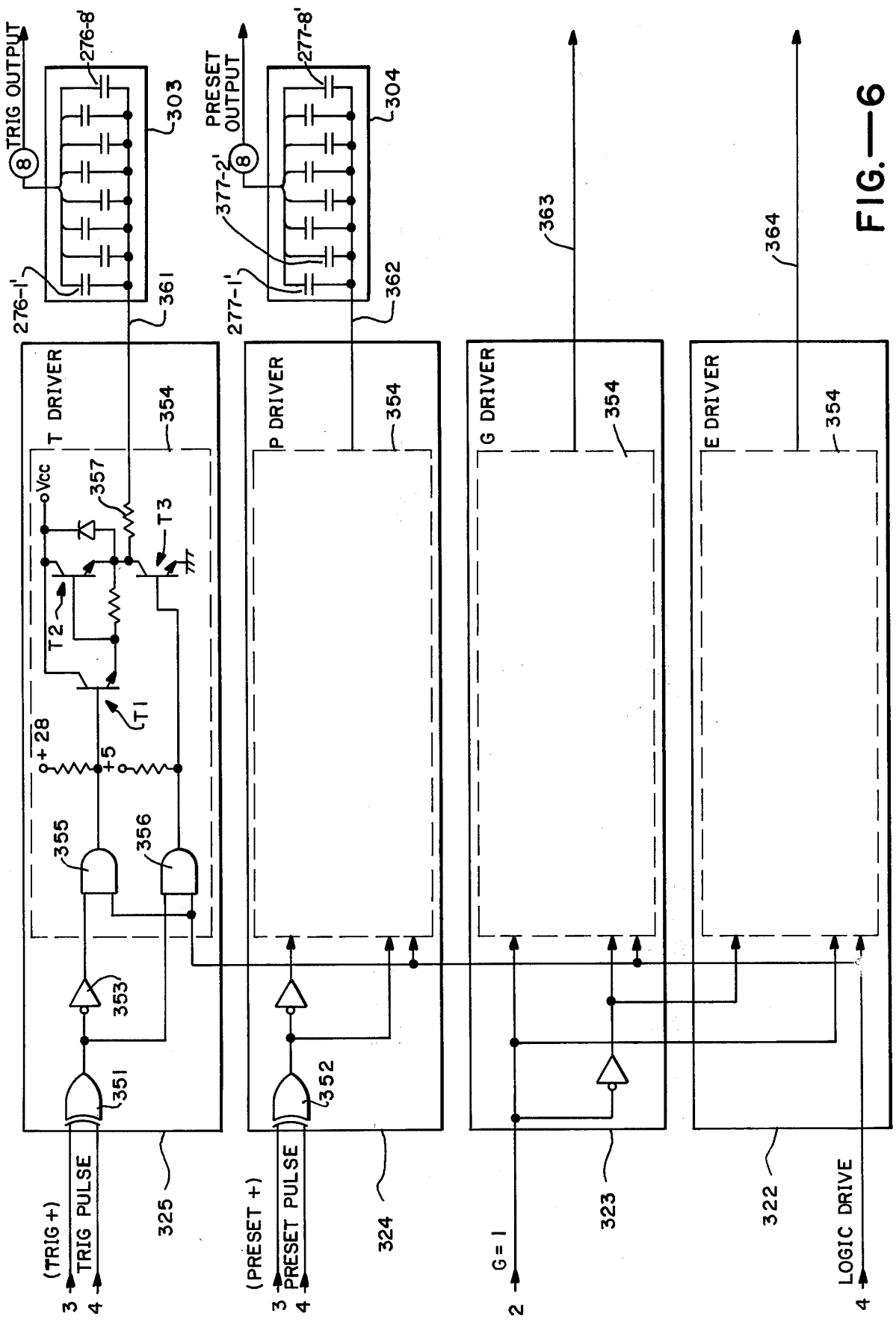
FIG.—6

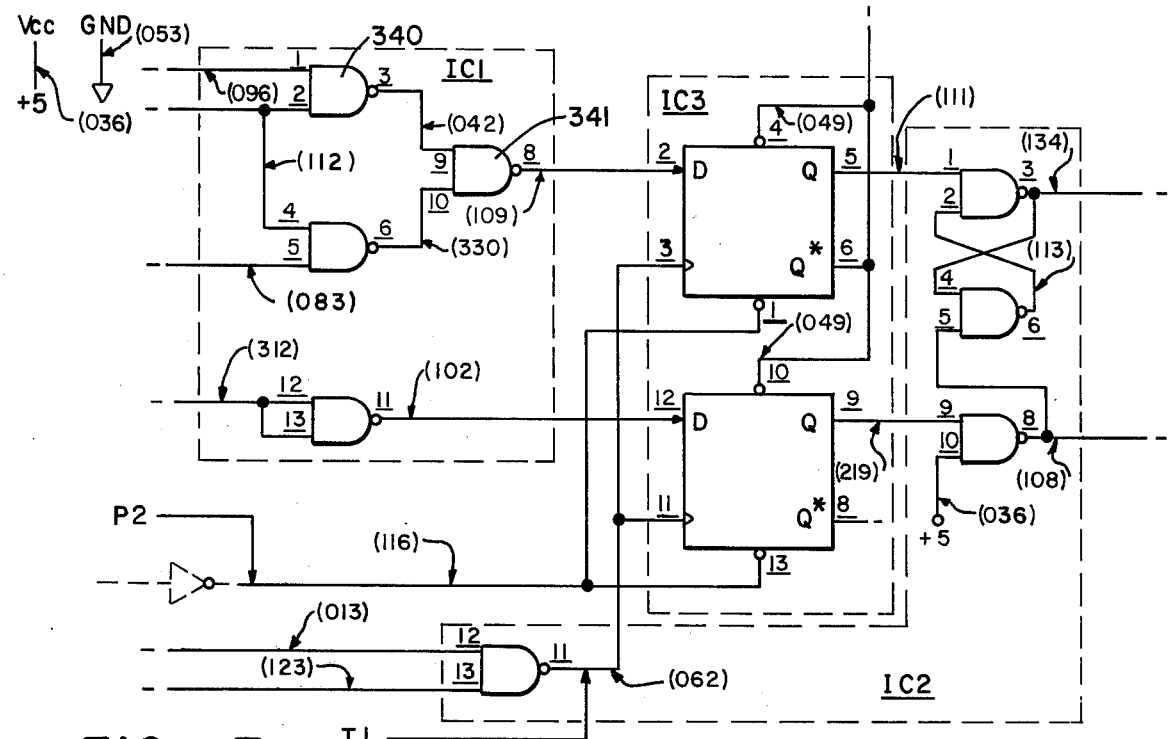
FIG.—7
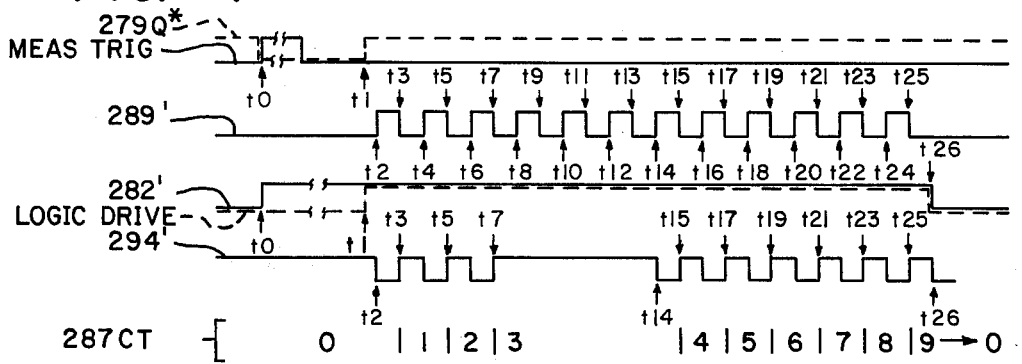
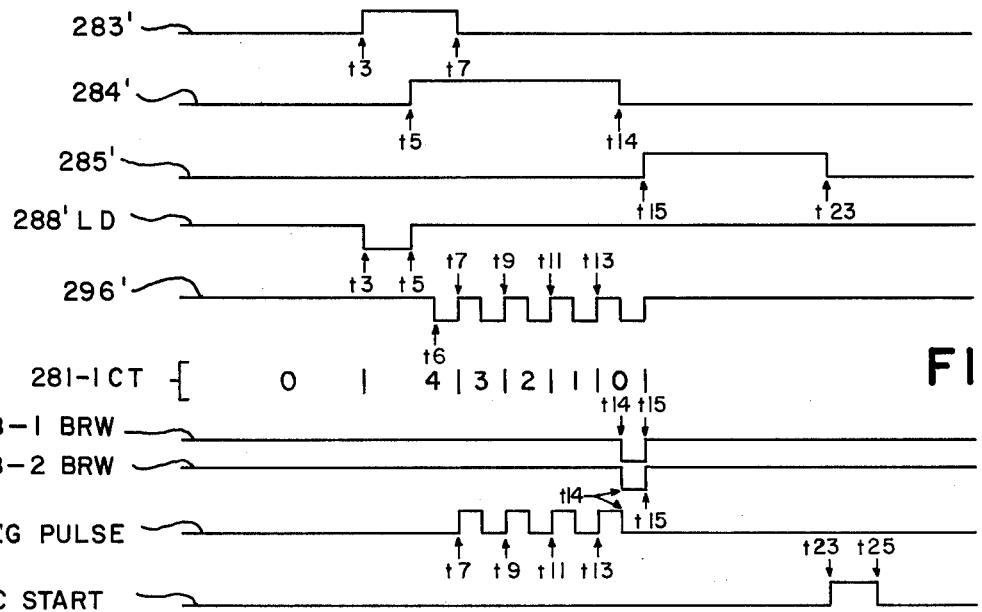
FIG.—8

PROGRAMMABLE TESTER METHOD AND APPARATUS

CROSS REFERENCE TO RELATED APPLICATION

PROGRAMMABLE TESTER, Ser. No. 537,563, filed Dec. 30, 1974, inverted by Ronald N. Borrelli and Douglas W. Raymond, now U.S. Pat. No. 3,931,506, and assigned to the assignee of the present invention.

BACKGROUND OF THE INVENTION

The present invention relates to measuring and testing methods and apparatus and more particularly to programmable, automatic circuit testers and in-circuit component testers.

The testing of circuits and components may be classified into the general categories of analog and digital testing although distinctions between the categories is at times imprecise.

The category of analog testing refers to excitation with and measurement of signals that are quantitative and continuous in nature. For example, measurements of voltage, current, frequency and time are typically classified as analog measurements. Analog testing is sometimes referred to as dynamic testing when time or some other dynamically variable parameter is involved or is sometimes referred to as static testing when a fixed, non-dynamincally variable parameter is involved.

The category of digital testing refers to the examination of logic patterns to determine whether they are binary 1's or 0's without regard to their quantitative values as long as they fall within gross threshold ranges. Digital testing is sometimes referred to as pattern testing.

Components are building blocks for forming circuits. For example, resistors, capacitors, inductors, delay lines, amplifiers, logical gates, and integrated circuits on semiconductor chips are all typical components. Components are characterized by having a common support or housing with one or more terminals for use in connecting the components into a larger circuit. Components are commonly manufactured to contain several like elements. For example, four NAND gates are typically manufactured in a single package as a component. Each logical element; that is, each NAND gate, is separately connectable in a circuit.

Circuits are a plurality of interconnected components which operate to perform functions. The points at which components are connected in a circuit are called nodes. Circuits perform functions by receiving input signals one or more selected input nodes to produce output signals on one or more selected output nodes. The input and output nodes are called external nodes. The input and output nodes may or may not be the same nodes. Either input or output nodes may not be present in some components.

In addition to the input and output (I/O) nodes, circuits typically include one or more internal nodes which are the connection points for components which are not utilized to conduct input or output signals to or from the circuits. Components such as semiconductor chips typically include component circuits fabricated on a single wafer from a plurality of non-discrete internal components such as diodes and transistors. Many of the internal nodes within integrated circuit chips typically are not utilized for connection of input or output signals. A limited number of I/O nodes (external nodes) are available from a semiconductor chip for connection of the chip in a larger circuit where the larger circuit typically includes other chips and components. Of course, if desirable, chips may be constructed with one or more internal nodes having connections which, like I/O nodes, are available for external connection. The I/O nodes of conventional circuits are identified as "pins" and have "pin numbers".

The relationship between non-discrete components and a semiconductor chip is the same relationship as between discrete components and a circuit board on which the discrete components are mounted and connected. The I/O nodes (internal nodes) on the semiconductor chip and the I/O nodes on a circuit board must be available for connection of signals. The internal nodes of semiconductor chips and of circuit boards are generally not available for making connections. Although circuit boards are more readily adapted, using test fixtures, for connections to internal nodes, semiconductor chips can be designed to make internal nodes available for connection.

The process of functional testing consists of applying at the input terminals of a device under test, (either a circuit or a component) the same signals normally applied in its intended application and determining whether or not the signals on the output terminals are acceptable for normal operation. In digital functional testing, a digital output is examined to determine if it matches the expected pattern of 1's and 0's. In analog functional testing, the output signals are measured so it can be determined if their incremental levels fall within acceptable limits of time, voltage, current or other parameters.

The process of component in-circuit testing consists of testing a component while it is connected in its normal manner within a circuit. The in-circuit testing of a component requires access to the nodes by which the component is interconnected in the circuit. The nodes may be internal or external or both.

Whenever a component is in-circuit tested, special problems arise because of the interaction of the component with the remainder of the circuit to which it is interconnected. Generally, some form of isolation or guarding is required in order to satisfactorily in-circuit test components. Additionally, a judicious selection of the test signals must be made in order to insure that either the component under test or the circuit it is interconnected with is not damaged.

In order to insure that the test signals do not damage the components of the circuit under test, the time duration of test signals has been made short, several microseconds or less, in order to limit the total delivered power.

Because of the high number of components and circuits which are manufactured, test equipment to be fully useful and economical must be automated, high-speed, highly reliable, and flexible. Automated testers have been available for the functional testing of circuits and components.

The above cross-referenced application provides a method and apparatus for automatic, programmed, in-circuit component testing and functional testing. In that invention, the programs were correlated with commanded measurement parameters and measurement sequences.

There is a need, however, for improved test apparatus and methods for the automatic, programmed, in-circuit testing of individual logic elements in a circuit under test.

SUMMARY OF THE INVENTION

The present invention is a method and apparatus for automatic, programmed, in-circuit testing of individual logic elements in a circuit under test. A driver apparatus is provided for selectively driving input nodes of a single selected logic element in the circuit under test to logic 1's, logic 0's, or a high impedance. A measurement unit apparatus senses a responsive output from the logic element under test. Program-operated connection switches are provided for connecting nodes of the circuit under test to the drive apparatus and to the measurement apparatus. A programmable processor operates in response to stored programs of instructions to test successively each individual logic element by sequentially connecting nodes of the circuit under test to the drive apparatus and measurement apparatus, by driving each selected logic element with a test signal and by sampling responsively the output generated. Each test is correlated with a particular type of lopic element. After a test is completed for one logic element, a test is performed for a second logic element, and so on, until all logic elements have been tested. The program in the processor contains subroutines which are correlated to particular types of logic elements. Each logic element of a given type causes one or more topology independent subroutine to be executed to test that type of logic element.

In order to facilitate the subroutine processing of like components, the apparatus of the present invention includes a translation store. The translation store is loaded with data for identifying which nodes are connected to which pins of each logic element to be tested in the circuit under test. Each time the processor reaches an instruction for testing a particular logic element, the translation store is accessed to determine the nodal address for each of the pins of that logic element. Thereafter, the device connection switches are closed to make connections in accordance with the information obtained from the translation store. In this manner, each logic element in a circuit under test is tested by the same subroutine independent of the actual location and connection of the logic element in a circuit under test.

The present invention also includes means for controling the current, voltage and power delivered to the circuit under test. Means are provided for controlling the duty cycle, that is, ratio of the conducting duration to the non-conducting duration of the drive signal.

In accordance with the above summary, the present information achieves the objective of providing an improved tester for the automatic, programmed, in-circuit testing of individual logic elements in a circuit under test without damaging any of the logic elements and by using topology independent subroutines of a program-controlled processor.

Additional objects and features of the invention will appear from the following description in which the preferred embodiments of the invention have been set forth in detail in conjunction with the drawings.

BRIEF DESCRIPTION OF THE DRAWINGS

FIG. 1 depicts an overall block diagram of the automatic test apparatus of the present invention interconnected to a sample device under test.

FIG. 2 depicts an electrical schematic representation of a first portion of the control logic in the FIG. 1 apparatus.

FIG. 3 depicts an electrical schematic representation of a second portion of the control logic of the apparatus of FIG. 1.

FIG. 4 depicts an electrical schematic representation of the output timing control circuitry of the FIG. 1 apparatus.

FIG. 5 depicts an electrical schematic representation of the sampling, conversion and memory units within the FIG. 1 apparatus.

FIG. 6 depicts an electrical schematic representation of the switch drivers and two of the six banks of switches within the FIG. 1 apparatus.

FIG. 7 depicts an electrical schematic representation of a sample circuit under test.

FIG. 8 depicts waveforms representative of the operation of the FIG. 1 apparatus.

DETAILED DESCRIPTION

In FIG. 1, the automatic test apparatus includes a programmed digital processor 6 which connects through an input/output controller 6' over a bus 38 to the logic tester 201 within the FIG. 1 apparatus. The processor 6 and the controller 6' are like that described in the above-identified cross-referenced application entitled PROGRAMMABLE TESTER.

The bus 38 from controller 6' connects to the output timing control 218. Bus 38 connects a MEAS TRIG signal line from controller 6' to control 218. An OUT READY signal line connects from control 218 to controller 6'.

Bus 38 also connects a 7-bit DATA IN bus from controller 6' to control logic 219 and to a switch control (E, F, G SW CTRL) 16. Bus 38 connects an IN STROBE signal line to the control logic 219 and to the switch control 16.

Controller 6' receives a 12-bit DATA OUT bus from the circuitry 221. Bus 38 connects an IN READY signal line from the switch control 16 to the controller 6'.

In FIG. 1, the control logic 219 is responsive to signals from the bus 38 to provide a plurality of logical control signals throughout the apparatus of FIG. 1. Specific details of the control logic 219 are described in connection with FIGS. 2 and 3.

In FIG. 1, the output timing control 218 is responsive to the MEAS TRIG signal line from controller 6', and other signal lines derived from the FIG. 1 apparatus, for enabling the drive circuits 222 through 225 and for controlling the circuitry 221. When the logic tester 201 has an output ready, the OUT READY line from control 218 to controller 6' is signaled. Specific details of output timing control 218 are described in connection with FIG. 4.

In FIG. 1, the drive circuits 222, 223, 224 and 225 provide the logical drive signals for testing the circuit under test 8. The drive signals are generated under program control through the output timing control 218 and the control logic 219. When enabled, drive circuits 222 through 225 operate through the switches 10, 12, 303 and 304, respectively, and the node connector 14 to provide the signals to the circuit under test. Specific details of a preferred embodiment of the drive circuits 222 through 225 (and the contacts of switches 303 and 304) are described in connection with FIG. 6.

In FIG. 1, the in-circuit tester 2 includes a node connector (NODE CONNECT) 14 which connects to up to N nodes in the circuit under test 8. In a preferred embodiment, N is equal to 1,000 and is specified by node addresses (000) to (999). The N nodes which are connected by the node connector 14 may include both internal and external nodes. Node connector 14 is a conventional device for making connections to printed circuit boards and is frequently referred to as a "bed-of-nails" fixture. The fixture operates, for example, by means of spring-loaded contacts juxtaposed a printed circuit board. The circuit board is vacuumed to the fixture to make the "nails" contact the nodes, one "nail" per node. Each of the N nodes from the node connector 14 are electrically connected to the device connection switches 10, 11 and 12. Additionally, 16 nodes are provided, eight for each of the switches 303 and 304. Also, up to ten X switches (X SW) 302 are provided for making additional connections to the circuit under test. Of course, the switches 302, 303 and 304 can also include up to N or more node connection points in common with or separate from the switches 10, 11 and 12.

The device connection switches include the E switch (E SW) 10, the F (F SW) 11 and the G (G SW) 12. Each of the connection switches 10, 11 and 12 is connected in common to the N lines of the node connector 14. The E switch 10 provides the E switch output line 197, the F switch 11 provides the F switch output line 198 and the G switch 12 provides the G switch output line 199. The functions of the E, F and G switches are to select one or more of the N node lines 5 as electrical connections to the E, F and G switch outputs 197, 198 and 199, respectively.

In a similar manner, the P switch (P SW) 303 electrically connects the single line 297 to a selected one of the eight lines 254. In a similar manner, the T switch (T SW) 304 electrically connects the single line 298 to a selected one of the eight lines 255. The X switches 302 are utility switches employed, for example, to connect power lines (Vcc and ground) to integrated circuits in the circuit under test.

The selection of individual switches within the switches 302, 10, 11 and 12 is under control of the X, E, F and G switch controller (X, E, F, G SW CTRL) 16. The controller 16 provides selection lines 256 to control the selecting of the switches 302, 10, 11 and 12. The switch controller 16 provides N select lines 29 to the E switch 10. One out of N of the lines 29 is selected at any one time.

The switch controller 16 provides N-P selection lines 30, P selection lines 31 and an F- INVERT* line 27 to the F switch 11. The controller 16 functions, under program command, to select one of the N lines 30 and 31 or to select the N-P lines 30 depending on the state of the F-INVERT* line 27. In the embodiment of the cross-referred application, P is a non-variable, fixed quantity less than N. However, P can be made program variable. For the logic tester 201 of the present application, only the one of N capability is actually employed.

The switch controller 16 provides N selection lines 32 and the G-UNLATCH* line 28 to the G switch 12. The lines 32 are selectable one at a time to select the G switches one at a time. The G switches, when selected, remain selected so that M out of N G switches are selectable. The G-UNLATCH* line 28 functions to unlatch all previously selected (latched) switches in switch 12.

The switch controller 16 is operated by commands from the processor 6 on a 7-bit DATA IN bus. The DATA IN bus is conventional and, in a preferred embodiment, receives data from processor 6 in the American Standard Code for Information Interchange (ASCII) format. Data is placed on the DATA IN bus by the processor 6 when a signal on the IN-READY line from the controller 16 is present. Processor 6 signals the presence of information on the DATA IN bus by a signal on the IN-STROBE line input to the controller 16.

The switch controller 16 functions, under commands on the DATA IN bus to energize a commanded one of the switch selection lines 256. The X, E, F and G switches responsively are closed to select X, E, F and G switch connections. The node lines in turn connect through the node connector 14 to particular locations in the circuit under test 8.

The switch controller 16 in FIG. 1 receives the programmed commands from the processor 6. The processor 6 communicates with the logic tester 201 by means of a programmed address. For example, in the present embodiment, tester 201 is assigned address 04. Any instruction which specifys address 04 will cause processor 6 to communicate with tester 201.

Tester 201 is similar to the in-circuit tester 2 and functional tester 4 in FIG. 1 of the above cross-referenced application. The functional tester 4 responds to an address 09 while the in-circuit tester 2 responds to an address 04, the same as the logic tester 201. When the logic tester 201 and the in-circuit tester are utilized in the same system, the 04 address is not confused since the in-circuit tester 2 and the logic tester 201 respond to different commands, albeit commands directed to the same 04 address.

Additional details of the switch controller 16 and the device connection switches 10, 11 and 12 are described in the cross-referenced application.

In FIG. 1, the single connection line 197 of the E switch 10 is connected through a contact K2 to the E driver 222. Whenever the contact K2 is closed, the E driver 222 is connected electrically to the line 197. In a similar manner, line 197 is connected through a contact K3 to ground. Whenever the contact K3 is closed, the line 197 is connected electrically to ground. Also, the K2 contact on the side opposite to line 197 is connected through a contact K5 and a resistor to line 198. When K5 and K3 are closed, a configuration for shorts testing is provided.

The contact K1 connects the single line 199 from the G switch 12 to the G driver 223. Whenever K1 is closed, driver 223 is electrically connected to switch 12.

The contact K4 connects the single line 198 from the F switch 11 to the sample and hold (S/H) circuit 313. Each of the contact K1, K2, K3, K4 and K5 is controlled in the open or closed state by means of the control logic 219.

In FIG. 1, the measurement and memory apparatus 221 includes a sample and hold (S/H) circuit 313 and an analog-to-digital converter (A/D CONV) 314. Circuit 313 in one embodiment is a model SHM-IC-1 manufactured by Datel, Inc., and converter 314 is a model 105-BCD-P manufactured by Function Modules, Inc. The operation of the sample and hold circuit 313 and the converter 314 are under control of the output timing control 218. Sample and hold circuit 313 receives an output signal from the device through the node connect 14 and the F switch 11 under test 8. An output signal is sampled and then the sampled value is converted in converter 314 to a 9-bit digital representation on output lines 219. The lines 219 are one input to a multiplexer (MUX) 307. The multiplexer 307 is a conventional device which provides up to twelve bits of data on output bus 320. Output bus 320 forms the DATA OUT bus to the I/O controller 6' and the 12-bit input bus 326 to the translation memory 301.

The other input to the multiplexer 307 are the bits BIT 1, ..., BIT 4 on lines 316 DATA IN bus. Multiplexer 307 is operative under control of the multiplexer and memory controller (MUX/MEM CTRL) 308 to select either the five bits from lines 219 or the four bits from lines 316. Multiplexer 307 selects the data as an input for the memory 301 or as an output for the DATA OUT bus.

The memory 301, in one preferred embodiment, is a conventional random access memory which stores up to 1,024 bits of translation data. Memory 301 is addressed by the 8-bit address bus 309 from the control logic 219. Bus 309 contains the address bits AO, ..., A7 for addressing memory 301. Memory 301 is either addressed to load translation information via the DATA IN bus and multiplexer 307 or to provide translated node addresses as an output on to the DATA OUT bus. Both the multiplexer 307 and the translation memory 301 are controlled by the multiplexer and memory controller (MUX/MEM CTRL) 308. Further details of the measurement and memory apparatus 221 are described in connection with FIG. 5.

Control Logic - FIG. 2

In FIG. 2, a first proportion of the control logic 219 of FIG. 1 is shown in detail. The 7-bit DATA IN bus from the controller 6' of FIG. 1, connects as an input to the ASCII decoder 299. Decoder 299 is any conventional device for providing a decode of data, in ASCII code, on the DATA IN bus. The particular symbols decoded by decoder 299 are (P), (K), (T), (W), (,) (M), (S), (+), and (−). These symbols are decoded by decoder 299 whenever an 04 address has been specified by controller 6! The symbols decoded by decoder 299 differ from the symbols decoded in the above identified application.

In FIG. 2, a plurality of conventional JK flip-flops 244 through 247 are shown for storing control conditions of the control logic 219.

The M flip-flop 244 is utilized for controlling the setting of the M+ flip-flop 245. The flip-flop 245 signifies the polarity of the drive signals applied to the G switch and the E switch of FIG. 1. When the Q output of the M+ flip-flop 245 is a 1, it signifys that the G switch receives a logic 1 and the E switch receives a logic 0. When the Q output of flip-flop 245 is a logic 0, it signifies that the G switch receives a logic 0 and the E switch receives a logic 1.

The MK flip-flop 246 is utilized to signify when a short test is to be performed. The DRIVE flip-flop 247 is utilized to signify positive and negative polarities to be applied by the preset or trigger pulses hereinafter described.

The MS flip-flop 248 is utilized to signify by a 1 on its Q output that a memory select operation is to be performed. The MW flip-flop 249 is utilized to specify that a memory write function is to be performed.

In FIG. 2, the digit store 251 is a conventional 5-bit shift register. The digit store 251 functions to sequence digits under certain control conditions. The digit store is clocked on the CLK input by positive going pulses of the IN STROBE* signal. The digit sequencer 251 is cleared by a signal on its CLR input whenever a (P), a (T) or an (M) decode is output from decoder 299. The data input, AB, is the logical value of (,) + (+) + (−) + (S) + (W) where the symbol "+" not in parentheses indicates a logical OR.

The outputs from the shift register digit store 251 appear on the outputs 1 through 5.

In FIG. 2, the AND gates 241, 242 and 243 receive the 3, 4 and 5 outputs of the digit store 251, respectively. Gates 241, 242 and 243 are enabled by AND gate 240 and form the MEM DIGIT −1, MEM DIGIT −2 and MEM DIGIT −3 signal lines.

In FIG. 2, the 4-bit latches 252 and 253 store the translation store address bits A0 through A3 and A4 through A7, respectively. The latches 252 and 253 are loaded from the DATA bus with the bits BIT 1, ..., BIT 4. The data bits are loaded into either the latch 252 or 253 under control of a 1 output from NAND gate 236 or NAND gate 237, respectively.

In FIG. 2, the switches K1, K2, K3, K4 and K5 control the corresponding contacts K1, K2, K3, K4 and K5 respectively, in FIG. 1. The switches K1 through K5 in FIG. 2 are solenoid actuated switches or their solid state equivalents. The switches K1 and K2 are energized whenever the output from AND gate 235 is 0. Gate 235 receives as inputs the Q output from the DRIVE flip-flop 247 and the Q* output of the MK flip-flop 246. The output from gate 235 also provides the DRIVE MK* signal where the symbol "." indicates a logical AND.

The switches K3 and K5 are controlled directly from the Q output of the MK flip-flop 246.

The contact K4 is controlled by the NOR gate 234. Gate 234 receives as inputs from the Q* output of the MK flip-flop 246 and the Q* output of the DRIVE flip-flop 247. The output from gate 234 is the MEAS ENABLE signal line.

The (A) output from the M+ flip-flop 245 is the G = 1 signal line.

The (P) output from the decoder 299 connects as an input to the OR gate 226.

The (K) output from the decoder 299 connects as the J input of the MK flip-flop 246 the K input to the DRIVE flip-flop 247 and to OR gate 233.

The (T) output from the decoder 299 connects as an input to the OR gate 226.

The (W) output from the decoder 299 connects as an input to the OR gate 228 and to the J input of the MW flip-flop via AND gate 258.

The (,) output from the decoder 299 connects as an input to OR gate 230.

The (M) output from the decoder 299 connects as an input to the OR gate 227 and to the J input of M flip-flop 244.

The (S) output from the decoder 299 connects as an input to the OR gate 229 and to the J input of the MS flip-flop 248.

The (+) output from the decoder 299 connects as an input to the OR gate 231 and to the J input of the M+ flip-flop 245.

The (−) output from the decoder 299 connects as an input to the OR gate 231 and to the K input of the M+ flip-flop 245.

The (B) output of decoder 299 is an input to NAND gate 334. Gate 334 also receives the IN-STROBE* signal. The output from gate 334 is a reset signal which, through NAND gate 335 and inverter 336, connects to the reset (R) inputs of flip-flops 244 through 249.

The OR gate 226 provides its output to the OR gate 227. The output from the OR gate 227 is a logical OR or the M, T and P signals and, when clocked by IN-STROBE* in NAND gate 257, is the clear (CLR) input for the digit store 251.

The OR gate 231 provides an input to OR gate 228 and the OR gate 228 provides an input to the OR gate 229 which in turn provides an input to the OR gate 230. The output from the OR gate 230 is the logical OR of the decoder 299 outputs (,), (+), (−), (W) and (S), which is provided as the data input (AB) to the digit store 251.

The digit store 251 is clocked on the CLK input by positive-going pulses of the IN STROBE* signal. The store 251 is cleared by a signal on its CLR input whenever a (P), a (T) or an (M) decode is output from decoder 299. The data input, AB, is the logical value of (,) + (+) + (−) + (W) + (S) where the symbol "+" not in parentheses indicates a logical OR.

The outputs from the shift register digit store 251 appear on the outputs 1 through 5.

In FIG. 2, the AND gates 241, 242 and 243 receive the 3, 4 and 5 outputs of the digit store 251, respectively. Gates 241, 242 and 243 are enabled by AND gate 240 and form the MEM DIGIT −1, MEM DIGIT −2 and MEM DIGIT −3 signal lines.

The output from OR gate 231 is also provided as an input to the K and J inputs of the MK and DRIVE flip-flops 246 and 247, respectively.

OR gate 233 receives inputs from the (K) output of recorder 299 and OR gate 228. OR gate 233 provides a logical OR of the (+), (−) and (K) outputs from decoder 299 and is connected to the K input of the MS flip-flop 248.

The M flip-flop 244 is clocked directly by the IN STROBE signal. The remainder of the flip-flops 245 through 249 are clocked by the IN-STROBE signal only when enabled by the AND gate 232. Gate 232 is enabled by the Q output of the M flip-flop 244.

The Q output of the MS flip-flop 248 is the MEM REA signal and is connected as an input to the OR gate 238 and the NAND gate 239.

OR gate 238 receives its other input from the Q output of the MW flip-flop 249. Gate 238 provides its output as an input to both the NAND gate 236 and the NAND gate 237. NAND gate 236 receives a second input from the 2 output of the digit store 251 and NAND gate 237 receives its other input from a 1 output from digit store 251. Gates 236 and 237, when satisfied, strobe the load (L) input of latches 252 and 253, respectively.

NAND gate 239 receives a second input from the Q* output of the MW flip-flop 249. The output from NAND gate 239 is the MUX ENABLE* signal.

Control Logic - FIG. 3

In FIG. 3, the remainder of the control logic 219 of FIG. 1 is shown in detail. In FIG. 3, the T flip-flop 260, the T+ flip-flop 261, the P flip-flop 262 and the P+ flip-flop 263 are all conventional JK flip-flops for storing control conditions. The T flip-flop 260 is utilized to store, with a 1 on its Q output, an indication that a trigger pulse is to be generated.

The T+ flip-flop 261 signifies, with a 1 on its Q output, that the trigger pulse has a positive polarity or with a 0 on its Q output has a negative polarity. The Q output forms the TRIG + line.

The P flip-flop 262 stores an indication, signified by a 1 on its Q output, that a preset pulse is to be generated. The P+ flip-flop 263 signifies that the preset pulse is positive or negative with a 1 or 0 on its Q output, respectively. The Q output forms the PRESET + line.

All of the flip-flops 260 through 263 are clocked by operation of the SHIFT CL signal which as indicated in FIG. 2, is the inverted IN-STROBE* signal from the controller 6' of FIG. 1.

The J input of the T flip-flop 260 is connected to the T decoded output of decoder 299 in FIG. 2. The K input of the T flip-flop 260 is derived from DIGIT-3 output of the digit store 251 of FIG. 2.

The J input of the T+ flip-flop 261 is derived from AND gate 265. Gate 265 receives the data input from the (+) decoded output of the decoder 299 of FIG. 1 and the enable input from the Q output of the T flip-flop 260.

The K input of flip-flop 261 is derived from the AND 264. Gate 264 receives the enable input from the Q output of the T flip-flop 260 and the data input from the (−) output from decoder 299 of FIG. 2.

The K input to the P flip-flop 262 is derived from the DIGIT 1 line of FIG. 2. The J input to flip-flop 262 is derived from the (P) decoded output of decoder 299 of FIG. 2.

The J input of the P+ flip-flop 263 is derived from the AND gate 267. Gate 267 receives an enable input from the Q output of P flip-flop 262 and a data input from the (+) decoded output of decoder 299 of FIG. 2. The K input of the P+ flip-flop 263 is derived from AND gate 266. Gate 266 receives an enable input from the Q output of the P flip-flop 262 and the data input from the (−) output of decoder 299 of FIG. 2.

All of the flip-flops 260 through 263 are reset by operation of the DRIVE MK* signal line from FIG. 2 whenever that line is a logical 0.

In FIG. 3, the store 271-1(T STORE-1), the store 271-2(T STORE-2), 272, and the store 271-3(T STORE-3) are 4-bit, 1-bit and 4-bit stores, respectively. The stores 271-2 and 271-3 store the number of trigger pulses which are to be generated. The store 271-1 stores the one of eight node address which is to receive the trigger pulses.

The stores 271-1 and 271-3 are enabled by a 1 on the DRIVE MK* line. When thus enabled, store 271-1 latches the BIT 1, ..., BIT 4 data when the output from NAND gate 269 is 1. Gate 269 has a 1 output when its inputs, the DIGIT -1 line and the Q output of the T flip-flop 260, are both 1's.

The T store 271-1 has its 4-bit output decoded in the T decoder 274. One of eight outputs of decoder 274 is selected for energizing one of the eight output switches 276-1 to 276-8 and the corresponding one of the switch contacts 276-1' through 276-8' (the latter shown in FIG. 6).

The store 271-2 is a 1-bit store which is loaded from the BIT 1 line. Store 271-2 is a D-type flip-flop which loads the BIT 10 value when clocked by the output of NAND gate 278. Gate 278 is enabled by the Q output of the T flip-flop 260 and receives data from the DIGIT-2 line. The Q output of store 271-2 is the high-order BCD digit of the count representing the number of trigger pulses. The Q output is designated the T10 line.

The store 271-3 loads the BIT 1, ..., BIT 4 data whenever the NAND gate 268 has a 0 output. Gate 268 has a 0 output of the T flip-flop 260 are both 1's. The output from the T store 271-3 forms the 4-bit T1, T2, T4, T8 bus which represents the low-order BCD digit of the count representing the number of trigger pulses.

The P store 273 stores a 4-bit representation signifying one of eight node addresses which is to receive a preset pulse. The P store 273 is loaded from the four bits BIT 1, ..., BIT 4. Store 273 is loaded whenever the DRIVE.MK* line is 0. Line DRIVE.MK* is connected to the enable (E) input of store 273. If enabled, store 273 stores the 4-bit input whenever the latch input (L) from NAND gate 270 is 0. Gate 270 provides a 0 whenever its inputs, the Q output of the P flip-flop 262 and DIGIT −1 line are both 1's.

The output from the P store 273 is four bits and is connected to the one of eight decoder 275. Decoder 275 is a conventional decoder which selects one of its eight outputs in response to the four bits stored in store 273. The outputs from decoder 275 connect to the switches 277-1 through 277-8. Each of the switches 277 is typically a solenoid actuated contact or other conventional switching device which opens and closes are corresponding switch contact. The eight switch contacts 277-1' through 277-8' corresponding to the switches 277-1 through 277-8, respectively, are shown as the switches 304 in FIG. 6.

Output Timing Control - FIG. 4

In FIG. 4, the output timing control 218 of FIG. 1 is shown in detail. The basic timing for the control 218 derives from a conventional 1 MHz oscillator 289. The state of the output timing control is controlled by a drive latch (DRIVE L) 282, a preset latch (PRESET L) 283, a trigger latch 284 and a sample and hold latch (S/H L) 285.

The drive latch 282 is held reset by the operation of OR gate 290. Gate 290 receives the carry (CRY) output from a BCD counter 287 and the MEAS ENABLE signal from the control logic of FIG. 2. Whenever the CRY and MEAS ENABLE signals are both 1's, a reset signal from gate 290 is removed thereby allowing latch 282 to be set whenever a MEAS TRIG signal from the controller 6' of FIG. 1 is switched to provide a 1 input to NAND gate 281. NAND gate 281 having two 1 inputs has its output switched from 1 to 0 thereby clocking one shot 279. One shot 279, having for example a 0.8 millisecond delay, switches its Q* output to 0. That 0 on 279Q* sets latch 282, provided that the reset from gate 290 has been removed, causing the latch's output to go to a logical 1 thereby enabling AND gate 291. When the single-shot 279 times out and 279Q* returns to 1, that 1 is input to gate 291 along with the 1 from set latch 282. Gate 291 having two input 1's provides a 1 output which enables, on the E input, the oscillator 289. The output from gate 291 also provides the LOGIC DRIVE signal after buffering in inverters 337 and 338.

The inverted output from gate 291 provides the clear (CLR) input to the BCD counter 287 and to the BCD counter stages 288-1 and 288-2.

The BCD counter 288, including stages 288-1 and 288-2 is a conventional counter which functions to count the trigger pulses which are output on the TRIG PULSE line. A number, corresponding to the low-order digit portion of the number of trigger pulses, is parallel loaded into counter stage 288-1 by the T1, T2, T4 and T8 bus whenever the LD input counter 288 is energized by a 1 decoded output from decoder 286.

In FIG. 4, drive latch 282 is a conventional latch which is set by operation of the MEAS TRIG signal. Latch 282 is reset by operation of the AND gate 290.

Gate 290 receives as its input the carry (CRY) output from counter 287 and the MEAS TRIG signal.

Counter 287 steps from a "zero" count in sequence to an "eight" count. The next clock pulse after an "eight" count causes the counter 287 to return to a "zero" count and to produce the carry signal on the CRY output. The "1", "2" and "4" outputs from counter 287 are input to a conventional decoder 286. Decoder 286 decodes the "one", "two", "three" and "four" counts of counter 287 to produce signals on the decoder "1", "2", "3" and "4" outputs, respectively.

Counter 287 is a sequencer which steps through the "one" to "eight" count sequence when the up clock (UP CLK) input is stepped by the output from the NAND gate 294. Gate 294 is enabled by a 1 output from NAND gate 295. When enabled, gate 294 passes clock pulses from the oscillator 289 to step counter 287.

Decoder 286 decodes outputs from counter 287 to sequence the FIG. 4 apparatus. The first output (1) from decoder 286 is connected to the set input of the preset (PRESET L) 283. The second output (2) from decoder 286 is connected to the set input of the trigger latch (TRIG L) 284. The third output (3) from decoder 286, is connected to the reset input of the latch 283.

The fourth output (4) from decoder 286, is connected to the set input of the sample and hold latch (S/H L) 285.

The "8" output of counter 287 is inverted and connected to the reset input of the latch 285.

The set output of preset latch 283 forms the PRESET PULSE line. The set output of trigger latch 284 is connected as an enabling input to both NAND gate 295 and the NAND gate 296.

The reset output of preset latch 283 connects as a second input to NAND gate 295. Gate 295 is satisfied to produce a 0 output whenever the preset latch 283 is reset and the trigger latch 284 is set.

Details of the operation of the output timing control of FIG. 4 are explained with reference to the waveforms of FIG. 8. The waveforms in FIG. 8 have numbers corresponding to lines in FIG. 4 which carry signals of the FIG. 8 type.

Referring to FIGS. 4 and 8, the sequencing of the FIG. 4 circuitry is initiated by the MEAS TRIG signal from the I/O controller 6' of FIG. 1. At time t0, the MEAS TRIG signal is switched to a 1 and remains a 1 until time t1. When the MEAS TRIG signal is 1, that 1 is inverted in inverter 281 to produce a 0. That 0 disables AND gate 291. That 0 also sets the drive latch 282 to produce a 1 on the latch output 282'. The setting of the drive latch 282 is indicated at t0 in FIG. 8 by the 0 to 1 transition of waveform 282'. Drive latch 282 is set; as shown at time t0, because the MEAS ENA line from the control logic 219 of FIG. 2 and the carry output (CRY) from the counter 287 are both 1's at t0.

After the MEAS TRIG signal, the one shot 279 times out and its output returns to 1 at t1, which together with the 1 on line 282' satisfies AND gate 291. At t1, gate 291 produces a 1 output which enables the 1 MHz oscillator 289. The first positive going clock pulse transition appears on line 289' at time t2 which is sometime after the oscillator 289 is enabled at t1. Subsequent clock pulse transitions on line 289' occur at times t3, t4, t5, t6, and so on, up until time t25.

At t1 when the output from AND gate 291 goes from 0 to 1, the CLR inputs to the counters 287, 288-1 and 288-2 go from 1 to 0 thus removing the signal which has held those counters in the cleared state. At t1, the 0 to 1 transition of the output from AND gate 291 also removes the reset signal from the reset inputs of the latches 283, 284 and 285. At t1, latches 283, 284, and 285 are all reset but are capable thereafter of being set. At t1 with all of the latches 283, 284 and 285 reset, the output 284′ from the trigger latch 284 connects a 0 input to NAND gate 295. Gate 295, therefore, is forced to have a 1 output which enables NAND gate 294. With the gate 294 thus enabled, gate 294 commences to pass the clock pulses on line 289′ after t1 to produce the pulses on line 294′. The first pulse on line 294′ commences at time t2. The positive going transitions of pulses on line 294′ clock the counter 287. Counter 287 is clocked from a "zero" to a "one" count at t3. The "one" count of counter 287 is decoded by the decoder 286 to enable the "1" output of decoder 286 as a 0 at time t3. That 0 operates to set the preset latch 283 at time t3 so that the preset latch output 283′ goes from 0 to 1 at t3. At t3, trigger latch 284 is still reset so that the 0 on line 284′ holds the output from NAND gate 295 a 1 and the NAND gate 294 is still enabled. With gate 294 still enabled, the next positive-going transition appears on line 294′ at t5. The transition at t5 clocks counter 287 to a count of "two". That "two" count is decoded by decoder 286 to enable the "2" output as a 0. That 0 sets the trigger latch 284 to produce a 1 on line 284′. At time t5, the output 283′ from preset latch 283 is 0 and that 0 forces the output from NAND gate 295 to remain a 1. Therefore, at t5, gate 294 remains enabled to pass the next clock pulse having a positive-going transition on line 294′ at t7.

At t3, the "1" output from decoder 286 has a 1 to 0 transition which by line 288′ LD causes the counters 288-1 and 288-2 to be parallel loaded. At t5, the parallel load signal is removed from line 288′ LD. Between the times t3 and t5, the T1, T2, T3 and T4 bits are parallel loaded into the counter 288-1. For purposes of an example, a four count of 0100 is assumed to be loaded. At the same time, the T10 bit is loaded into the low-order bit of counter 288-2 while all 0's are loaded into the high-order bits of counter 288-2. T10 is assumed to be 0 for the purposes of an example.

At t5, the trigger latch 284′ was set and remains set at t7. At t7, the positive going transition on line 294′ clocks counter 287 and causes it to advance to store a "three" count. The "three" count is decoded by decoder 286 to produce a 0 on the "3" output. That 0 from decoder 286 resets the preset latch 283 at t7. Therefore, a PRESET PULSE signal occurred on line 283′ between t3 and t7.

At t5, the setting of the latch 284 causes the line 284′ to go to a 1 and that 1 enables the NAND gate 296. Therefore, line 296′ contains clock pulses inverted from line 289′. Line 296′ has its first positive-going transition at t7. That positive-going transition at t7 causes counter 288-1 to be down counted from a "four" count to a "three" count at t7. Also at t7, the "3" output from decoder 286 as a 0 resets the preset latch 283′. With the trigger latch 284 remaining set and the preset latch 283 reset, both inputs to NAND gate 294 are 1. That 1 satisfies gate 295 forcing its output to a 0 at t7. Therefore at t7, NAND gate 294 is inhibited from passing clock pulses while NOR gate 293 passes inverted clock pulses. Gate 293 passes the first positive-going trigger pulse at t7 to form the first TRIG PULSE signal.

Also, at t7, gate 296 is enabled and forms a positive-going transition which clocks the counter 288-1. Since counter 288-1, for the purposes of the present example, was loaded with a "four" count, counter 288-1 is stepped from a "four" count to a "three" count at t7. Since gate 294 is inhibited, counter 287 is not clocked after t7 while gates 293 and 296 remain enabled. Therefore, trigger pulses on the TRIG PULSE line are sequentially generated at t9, t11, and t13. Correspondingly, the count in counter 288-1 is decremented "three", "two", "one" and "zero" at t9, t11, and t13, respectively. When counter 288-1 is a "zero" count, a borrow signal (BRW) is generated during the 0 level of the down clock line 296′. The 0 level on line 296′ results in 0 level in the BRW output of counter 288-1 between t14 and t15. Since in the particular example explained, the counter 288-2 was loaded with a "zero" count, the BRW output of the counter 288-2 is also a 0 level between t14 and t15. If counter 288-2 had been loaded with a non-zero count, then counter 288-2 would first have to be down-counted to "zero" before a BRW output would occur.

The 0 from the BRW output of counter 288-2 is propagated through the OR gate 280 to reset the trigger latch 284.

For example, if counter 288-2 is loaded with another number such as a "one" then the BRW output from counter 288-2 is not a 0 between t14 and t15. Rather, a "one" count in counter 288-2 would be decremented to a "zero" count at t15. Thereafter, counter 288-1 would be decremented a full ten counts ("zero", "nine", . . . , "one", "zero") and on the tenth count, the BRW output of both counters 288-1 and 288-2 would be 0 in the manner indicated in FIG. 8 between t14 and t15 but at a later time. When the BRW output of counter 288-2 is 0, the 0 is propagated through OR gate 280 to reset latch 284. When latch 284 is reset, NAND gate 296 is inhibited from clocking counter 288-1. With latch 284 reset, the output from NAND gate 295 is forced to a 1 at t14 thereby enabling counter 294 and inhibiting gate 293. After t14, no additional pulses appear on the TRIG PULSE line. At t15, a positive-going clock pulse on line 294′ steps the counter 287 to a "four" count. Decoder 286 decodes the count and sets the sample and hold latch 285 at t15. Gate 294 remains enabled and continues to count clock pulses up to a "nine" count. At the "eight" count at t23, an output from counter 287 is inverted to reset the sample and hold latch 285. The SAMPLE COMMAND* signal appears on line 285′ between t15 and t23.

The output from counter 287 remains a 1 between t23 and t25 to form a signal on the ADC START line. When counter 287 is at a "nine" count, the 0 level on line 294′ causes a 0 output on the carry out line (CRY).

The 0 on the CRY output of counter 287 between t26 and t27 is propagated through OR gate 290 to reset the drive latch 282. With the drive latch reset, the output from gate 291 is 0 so that the latches 283, 284 and 285 are held reset and the ocsillator 289 is held disabled. The circuitry of FIG. 4 is not again utilized until another MEAS TRIG signal is generated by the controller 6′ of FIG. 1.

Sampling, Conversion and Memory Apparatus - FIG. 5

In FIG. 5, the analog sampling and conversion apparatus and the translation memory apparatus of FIG. 1 are shown in further detail.

The translation memory 301 includes the 3-digit stages 301-1, 301-2 and 301-3. Each of the stages is capable of storing 256 4-bit BCD characters. Each of the memories 301 is addressed by the 8-bit address bus A0, . . . , A7. Data is input to and output from the memories 301-1, 301-2 and 301-3 on the 4-bit buses 326-1, 326-2 and 326-3, respectively. Each of the memories is controlled to read or write on the R/W input which is derived from the MEM READ line. When the MEM READ line is 1, the memories are activated to read, and when that line is 0 the memories are activated to write. Data is written into the memories 301 when the enable (E) input is 0. The enable input for memory 301-1 is derived from the OR gate 304. Memory 301-2 receives the enable input from the OR gate 305. Memory 301-1 receives the enable input from the OR gate 306. Gates 304 through 306 receive as one input the inverted MEM READ line and they are enabled whenever the MEM READ line is 1. The other inputs to the gates 304, 305 and 306 are the MEM DIGIT-1, MEM DIGIT-2 and the MEM DIGIT-3 lines respectively. Gate 304 produces a 0 output to enable a write into memory 301-1 when MEM READ is 0 and MEM DIGIT-1 is 0. Gate 305 produces a 0 output to enable a write into memory 301-2 when MEM DIGIT-2 and MEM READ are both 0's. Gate 306 produces a 0 output to enable a write into memory 301-3 whenever MEM READ and MEM DIGIT-3 are both 0's.

In FIG. 5, the analog measurement unit 312 includes the sample and hold (S/H) circuit 313. Sample and hold circuit 313 receives the signal from the F switch line 330 of FIG. 1. The signal on line 330 is sampled by the sample and hold circuit 313 each time a sample command appears on the SAMPLE COMMAND* line from FIG. 4. The output from sample and hold circuit 313 on line 331 is input to the A/D converter 314. In one preferred embodiment, converter 314 is a model 105 BCD P manufactured by Functional Modules Inc. of San Diego, California.

The converter 314 converts the analog level on line 331 to a digital representation on output line 219 whenever a 1 appears on the ADC START line from FIG. 4. When the conversion has been completed after an ADC START signal, an output is generated on the READY output to signal that the data on bus 219 is valid.

In FIG. 5, the output from the converter 314 is connected on 4-bit bus 219-1 to a multiplexing unit 307-1. Bus 219-1 connects a first BCD digit to multiplexer 307-1. Output bus 219-2 from converter 314 connects a second BCD digit to the multiplexer 307-2. The overflow output (OR*) from converter 314 is connected by line 219-3 as an input to the multiplexer 307-3. The output on line 219-3 represents the inverted high-order bit of the BCD representation of the converted signal. The high-order bit on line 219-3, after inversion, is input to the multiplexer 307-3. Each of the multiplexers 307-1 through 307-3 also receives an input from the four-bit bus 332 containing the input bits BIT-1, . . . , BIT-4. Multiplexers 307 are operative to select either the output 219 from converter 314 or the data bits BIT-1, . . . , BIT-4 on bus 332.

Multiplexers 307 are enabled by operation of the MEM READ signal line. When thus enabled, multiplexers 307 select one of the two inputs 219 or 332 for connection on the output buses 320-1, 320-2, and 320-3. The selection of an input is under control of the MUX CTRL line. Whenever the MUX CTRL line is 0, multiplexers 307 are operative to select the converter data from bus 219. Whenever the MUX CTRL line is 1, the multiplexers 307 are operative to select the data from the bus 332. The output buses 320-1, 320-2 and 320-3 for multiplexers 307-1, 307-2, and 307-3 are DOT-OR'ed with the buses 326-1, 326-2 and 326-3, respectively.

During a memory write operation, data is connected from the multiplexers 307 and is input to the memories 301. During a memory read operation, data is output from the memories 301 to the bus 327. Also during a memory read, data is output from the multiplexers 307 to the bus 327. Data appears on the bus 327 either from the memories 301 or from the multiplexers 307 depending upon the control state of the control 308.

Logic Drivers FIG. 6

In FIG. 6, the T driver 325 is shown in detail as typical of the logic drivers 322, 323, 324 and 325 of FIG. 1.

The driver 325 includes the EXCLUSIVE-OR gate 351. Gate 351 receives the TRIG PULSE line and the TRIG+ line as inputs. The output from gate 351 is input to the common drive circuit 354 both directly and through the inverter 353. The inverted input connects to an AND gate 355 and the non-inverted input connects to an AND gate 356. Both gates 355 and 356 receive as the other input the LOGIC DRIVE line. When gate 355 has a 1 output, transistors T1 and T2 are conducting to provide a logical 1 drive on line 361. When AND gate 356 has a 1 output, transistor T3 is conducting to provide a logical 0 drive on line 361. Gate 355 is only on with a 1 output when gate 356 is off and vice-versa. Accordingly, transistors T1 and T2 are only on when transistor T3 is off and vice-versa. Gates 355 and 356 may both be off with 0 outputs and in that case all transistors T1, T2 and T3 are off. When T1, T2 and T3 are off, line 361 is a high impedance state. The output from the T driver 325 on line 361 is connected to the T switch bank 303.

The T switch bank includes the eight contacts 276-1' through 276-8'. Only one of the switch contacts 276-1' through 276-8' is closed at one time. A closed one of the switch contacts conducts the state of line 361 (logic 1, logic 0 or high-impedance) through the node connect 14 of FIG. 1 to the circuit under test 8.

In FIG. 6, the common circuit 354 of the P driver 324 is enabled by the LOGIC DRIVE signal. When thus enabled, the common circuit 354 provides a logic 1 or a logic 0 on output line 362. When not enabled, circuit 354 provides a high impedance state for line 362. The output on line 362 is connected through an enabled one of the contacts 277-1' through 277-8' through the node connecter 14 to the circuit under test 8.

In FIG. 6, the G driver circuit 323 includes a common drive circuit 354. The common drive circuit 354 provides a logic 1, a logic 0, or a high impedance state to the output line 363. The logic 1 or logic 0 appears on line 363 whenever the LOGIC DRIVE is enabled. A logic 1 appears on line 363 whenever the G = 1 line is a logic 1. A logic 0 appears on line 363 whenever the G = 1 line is a logic 0.

The E driver circuit 322 operates to provide a logic 0, a logic 1, or a high impedance state on line 364. When the LOGIC DRIVE is 1, the logic level on line 364 is the complement of the output on line 363.

In FIG. 6, the common circuit 354 of the P driver 324 is enabled by the LOGIC DRIVE signal. When thus enabled, the common circuit 354 provides a logic 1 or a logic 0 on output line 362. When not enabled, circuit 354 provides a high impedance state for line 362. The output on line 362 is connected through an enabled one of the contacts 277-1' through 277-8' through the node connector 14 to the circuit under test 8.

In FIG. 6, the G driver circuit 323 includes a common drive circuit 354. The common drive circuit 354 provides a logic 1, a logic 0 or a high impedance state to the output line 363. The logic 1 or logic 0 appears on line 363 whenever the LOGIC DRIVE is enabled. A logic 1 appears on line 363 whenever the G=1 line is a logic 1. A logic 0 appears on line 363 whenever the G=1 line is a logic 0.

The E driver circuit 322 operates to provide a logic 0, a logic 1, or a high impedance state on line 364. When the LOGIC DRIVE is 1, the logic level on line 364 is the complement of the output on line 363.

Circuit Under Test FIG. 7

In FIG. 7, one example of a circuit under test 8 of FIG. 1 is shown. The circuit under test includes the three integrated circuits IC1, IC2 and IC3. The IC1 circuit is typically a quad NAND circuit which is typically sold under the number SN 7400. The IC2 is another SN 7400 quad NAND gate circuit. The IC3 is a dual D-type flip-flop commonly marketed under the number SN 7474. In FIG. 7, the pin numbers for the integrated circuits are identified by underscoring and the node numbers are identified in parenthesis. The pin numbers are those numbers assigned by the manufacturer for making interconnection to the integrated circuit. The nodes are those places on the circuit where the node connector 14 of FIG. 1 connects to the circuit under test. For example, the node (096) connects to pin number 1 of the integrated circuit IC1. Node (112) connects to both pin number 2 and pin number 4 of IC1. In FIG. 7, the P2 output from the P switch contacts 304 of FIG. 6 is the same as the node (116). Node (116) connects to pins 1 and 13 of IC3. The P2 output from the P switch 304 is the output from contact 377-2' of FIG. 6. In a similar manner, the T1 switch output is the contact 276-1' of the T switches 303 of FIG. 6. The T1 contact point in FIG. 7 is the same as node (062) which connects to the pin 11 of IC2 and pins 3 and 11 of IC3.

Programming Format

The programmed operation of the present invention includes the programming tasks of indentification, connection and measurement.

Identification

The identification task functions to identify the chip and pin numbers being tested in the circuit under test so that those numbers can be identified if a failure is detected.

The identification tasks is carried out by writing information into, and selecting information out from the memory 301 of FIG. 1. Memory 301 includes 3-digit data locations at each of the address 00, 01, ... , 99. The memory write command is identified by the code MW. The MW command is used in a format which includes in order from left to right a 2-digit field address (04), the 2-digit command (MW), a 2-digit memory address, and a 3-digit data field where the data field is stored at the address specified by the 2-digit memory address. The field address, 04, specifies the logic tester 201 of FIG. 1.

Multiple addresses may be specified and stored with the MW command. The format for multiple addresses includes the 2-digit field address (04), the 2-digit command (MW), followed by a plurality of 5-digit blocks separated by comas where each block includes a 2-digit memory address and a 3-digit data field. A coma between each 5-digit block continues the command. There is no coma after the last entry. Memory locations may be addressed and loaded or fetched at any order. The contents of each memory location unchanged after a MW command remains until that location is readdressed and loaded with new data with a new MW command.

The memory select command (MS) is similar to the memory write (MW) command. The format of the MS command includes a 2-digit field address (04), the 2-digit command (MS), and a 2-digit memory address. When the MS command is employed, the 3-digit contents of the selected memory address appear on the DATA OUT bus of FIG. 1.

Chips or other elements, like those of FIG. 7, are identified by pre-assigned identification numbers on the circuit under test. In FIG. 7, the IC1 chip is identified as element 001, the IC2 chip is identified as element 002 and the IC3 chip is identified as element 003.

In memory 301, address 99 is employed to store a 3-digit element identification number. For FIG. 7, the identification number is either 001, 002 or 003. In memory 301, address 00 is used to store a 2-digit output pin number. For example, for IC1, the NAND gate at the top has input pins 01 and 02 and has output pin 03. When that NAND gate is to be tested, the chip number 001 and the output pin number 03 are stored in memory at locations 99 and 00, respectively. The statement appears on (04MW99001,00 003. The statement means write into memory address 99 the chip number 001 and write into memory address 00 the pin number 003. In order to thereafter fetch information from memory location 99, the statement (04MS99 is employed. The statement means select the contents of location 99 onto the DATA OUT bus. The contents would be 001.

Connection

The connection task is carried out by programming the system to actuate the E,F,G,P,T and X switches of FIG. 1. The E switch 10, the F switch 11 and the G switch 12 are available for input and output connections on logic gates or other circuit elements of the circuit under test. The X switch 302 is utilized to make a power connection, Vcc, to the circuit under test. The P switch 303 is utilized to make connections for preset signals and the T switch 304 is utilized to made connections for trigger pulses.

Only one output of an element is examined at any one time. The F switch 1 is utilized to connect to the output pin of the element under test. The format for connecting one pole of the F switch to the output pin to be tested is as follows. The format includes a 2-digit field address (04), a 1-digit identifier, F, and a 3-digit data field for identifying the nodal address of the output pin to be connected. Connection of the F switch to the pin 3 outpin of IC1 is carried out by the format 04F042 where 042 is the nodal address of pin number 3. The command 04F042 causes the F switch 11 to connect the node 042 to the line 198 which through the K4 contact is connected to the measuring unit 221.

The input connections for the element under test are made by programming the apparatus to actuate the E switch 10 and the G switch 12. The format for the E and G switches is basically the same as for the F switch. The connection of the E, F and G switches can be combined into a single programming statement. A single statement for connecting the NAND gate of IC1 is as follows: (04E096G112F042. That statement means that the E switch connects to the node 096 (NAND gate pin 1) the G switch connects to node 112 (NAND gate pin 2) and the F switch connects to node 042 (NAND gate pin 3).

The G switch 12 is capable of connecting a plurality of nodes to the same point. For example, if it is desired to connect the input pins 1 and 2 of the first NAND gate of IC1 to the same common logic level, then the programmed statement is as follows: (04G096,112F042. That statement means that nodes 096 and 112 are connected in common by the G switch while the F switch connects the output node 042.

For 2-input NAND gates, like IC1, and IC2 of FIG. 7, the first address, 01, and the second address 02 of memory are utilized to store the nodal addresses of the input pins and the third memory address, 03, is utilized to store the nodal address of the output pin. The output pin number (as distinguished from node number) is stored in memory address 00. In connection with the first NAND gate of IC1 in FIG. 7 the following statement would be entered (04MW00003,01096,02112,03042. The meaning of this statement is that, for the logic tester (04), the output pin 003 is stored in memory address 00, the input nodal address 096 is stored in memory location 01, the input nodal address 112 is stored in memory location 02 and the output nodal address 042 is stored in memory location 03. The connections of the P switch are achieved by a 1-digit number following the P+ or P− symbol in a program statement. The 1-digit number is from 0,1, . . ., 8. A 0 means that no P switch is connected while any number from 1 to 8 indicates the one of eight switches to be closed. The format for the T switch includes an additional 2-digit number between the T+ or T− symbol and the 1-digit number which specifies one of eight T poles. The 2-digit number specifies the number of trigger (clock) pulses to be applied.

The X switches 302 are connected as a result of X command from the processor 6.

Measurement

For static stimuli, the E switch 10 and the G switch 12 are employed to connect the drive signal from the E drive 222 and the G drive 223, respectively, to the nodal points connected in the circuit under test by the switches 10 and 12. The E drive 222 and the G drive 223 provide as outputs either a logic 1 or a logic 0. The drive status, logic 1 or 0, of the E and G switches is determined by programmed commands. The E and G pole outputs are always at opposite logic states. To drive the G pole to a logic 1 and E pole to a logic 0, the program statement (04M+ is employed. To drive the E pole to a logic 1 and G pole to a logic 0 the program statement (04M− is employed.

In addition to the M+ or M− commands which establish the nature of the input stimuli, an actual measurement may additionally require preset and trigger pulses and an actual measurement.

Since a separate measurement instrument may be employed to measure the output which occurs as a result of the triggered measurement stimuli, a measurement instrument is specified in the program command. For example, to indicate measurement instrument number 6 and to specify the measurement states, the program statement appears as (006 (04M+.

Preset commands generate a single 2 microsecond pulse at the beginning of the measurement sequence. The preset pulse is generated by the P drive 224 under programmed command. The 2 microsecond pulse is connected through the P switch 303 to one of eight selected preset lines 254. The P+ command indicates a preset function which is normally a logic 0 and which is switched to a logic 1 for the microsecond pulse period. The P− command indicates a preset function which is normally a logic 1 with a logic 0 pulse. The P+ or P− command is followed by a 1-digit number from 0 to 8 which specifies which is any of the eight lines 254 is to receive the preset pulse. If the digit is 0 then none of the lines 254 is to receive a preset pulse. The format for the preset pulse to be applied to a typical line, such as line 6, is (04P+6. The meaning of the program statement is that a positive (logic 1) preset pulse will be applied to line 6 at the beginning of the measurement sequence.

The trigger or clocking function is performed by the T switch 304 and the T drive 225 of FIG. 1. The T drive 225 generates from 1 to 19 positive-going or negative-going trigger pulses which are connected by T switch 304 to a selected node in the circuit under test 8. The command for programmed trigger pulses is T+ for positive-going pulses and T− for negative-going pulses. The T+ or T− command is followed by a 2-digit number which specifies the number of trigger pulses to be generated. The 2-digit code is followed by a 1-digit number which specifies a 0 (no line) or one of the eight lines 225 from the T switch 304 of FIG. 1. The format for the trigger command is typically as follows (04T+157. The program statement indicates that 15 positive going trigger pulses are to be applied to the 7th one of the lines 255 of FIG. 1.

The 15 pulses of the pulse train begin 500 nanoseconds after a preset pulse is completed.

Sample Program

A sample program for testing the sample circuit of FIG. 7 in accordance with the present invention is shown in the following CHART I.

```
100  <(000(04E999F999G999XXBL0
110  (19"L ISODRIVE SAMPLE PROGRAM...
120  PRESS START TO BEGIN....*/
130  (99W(04L0XX1B(971):):)
140
150  2 INPUT POS NAND
160
170  (98A
180  (04MW99001
190  (04MW00003,01096,02112,21042;
200  (04MW00006,01112,02083,21330;
210  (04MW00008,01042,02330,21109;
```

```
220 (04MW00011F102G312M-(98H;&(04M+(98L;$(98A
230
240 (04MW99002
250 (04MW00003,01111,02113,21134;
260 (04MW00006,01134,02108,21113;
270 (04MW00008F108G219M-(98H;&(04M+(98L;$(98A
280 (04MW00011,01013,02123,21062;
290
300 (98M%
310 SUBROUTINE PACKAGE....
320
330 (99A
340 (04G999E999MS21(98F;
350 (04MS01(98G;(04MS02(98E;
360 (04M+(98H;&
370 (04M-(98H;&
380 (04E999MS02(98G;
390 (04M+(98L;$(98A*
400 (99M
410
420 D FLIP-FLOP
430
440 (99A
450 (04MW99003
460 (04MW00005,01109,02116,03049,04062,21111,80001;
470 (04MW00009,01102,21219;
480
490 (98M%
500 SUBROUTINE PACKAGE...
510
520 (99A
530 (04G999E999T+000MS21(98F;
540 (04MS03(98E;(04MS02(98G;
550 (04M-(98H;&
560 (04M+(98L;&
570
580 (04E999MS01(98G;(04MS03;
590 (04MS80T+(90(04000101
600 (04M+(98H;&
610
620 (04G999MS01(98E;(04MS03(98G;(04MS02;
630 (04M+(98L;$(98A*
640
650 (99M
660
670
680 (19"TEST COMPLETE...
690 PRESS START TO RETEST..."
700 (970)(04BE999F999G999XXL0/(98W%>
710
720 ISODRIVE UTILITY ROUTINES
730
740 (99E
750 (006(04E(90(040111*
```

```
760  (99F
770  (006(04F(90(040111*
780  (99G
790  (006(04@G(90(040111*
800  (99H
810  (006(910000(010055(020024&(982;$(000(019999(029999*
820  (99L
830  (006(910000(010008(020024&(982;$(000(019999(029999*
840  (99Z
850  (19"IC "(04L1MS99(90(190111(04MS00(010000(020000&
860  (19" PIN "(90(190011$(19"
870  "(919999*
880  >
```

In CHART I, program statement 100 is employed to initially clear the system. The (000 field addresses an internal register field 91 and specifies that the data for that internal register has no address and hence operates to clear the system. The (04 field specifies the logic tester 201 of FIG. 1. The XX field specifies that the X switch 302 is to be cleared so that no connections are made. The B field specifies that all other stores are to be cleared. The L0 field sets the L register, any addressable register internal to the processor 6, to 0.

Statements 110 and 120 are merely an identification label and are used on a display or other output device (indicated by 19) of the system.

Statement 130 includes a return address 99W so that return to statement 130 can be made after address 98W is executed. The 98W designation appears in statement 700.

In statement 130, the (04 field addresses the logic tester 201 of FIG. 1. The L0 field sets the L register to 0, the XX1 field specifies that the 2-pole X1 switch of the X switches 302 is closed to connect the Vcc voltage and ground (GND) to appropriate nodes within the circuit under test 8. Vcc is connected to node 036 and ground to node 053. The B field clears all other clearable stores. The (971) field causes the vacuum pump to close the bed of nails fixture (within node connect 14) to the nodal points in the circuit under test 8.

Statement 150 is for program identification and is not part of the execution of the program.

2-Input NAND Test.

Statement 170 is the start of the 2-input NAND gate test. The basic program for the 2-input NAND gate test appears from statement 170 through statement 280. Of those statements, statements 180 through 220 relate to the IC1 of FIG. 7 and statements 240 through 280 relate to the IC2 of FIG. 7. Since all of the statements 180 through 280 involve the use of the logic tester 201, they are introduced by the (04 field. The subroutines from statements 310 to 400 are part of the 2-input NAND gate test. The subroutines from statement 740 to 870 are used with test for any element.

In statement 180, a memory write of the number 001 into memory location 99 is specified. The 001 specifies the IC1 chip of the circuit under test 8 in FIG. 7.

In statement 190 up to the first coma, the output pin number, 003, is written into memory location 00. From the first to the second comma, the node number, 096, of a first input pin is written into the 01 location of memory. Between the second and third coma, the node number 112 is written into the 02 memory location. Between the third comma and the semicolon, the node number 042 is written in to the 21 memory location. The semicolon is a "go-to" instruction which specifies a transfer to the address, (99A, with a command to remember the location at which the "go-to" instruction occured.

The (99A address appears as statement 330 and is a subroutine package associated with the 2-input NAND gate test.

In statement 340, the E switch is set to the unused number 999 and the G switch is set to the unused number 999. The MS21 field is a memory select command for reading out the contents of the 21 memory location. The 21 memory location was stored with the node number 042 in statement 190. The field (98F; specifies a "go-to" command which transfers to (99F in statement 760. After statement 760, the program goes to statement 770.

In statement 770, the 006 field specifies that the measured data return will be returned to measuring instrument number 6. The (04 field specifies the logic tester 201 of FIG. 1. The F field specifies that the F switch 11 of FIG. 1 is to be loaded with a number which is to be determined by an extraction process. The extraction process is identified by the field (90. The data is extracted from the DATA OUT bus of the logic tester 201. The field 0111 specifies that the extracted data includes three BCD digits. The results of executing statements 340 and 770 is to load the node number 042 into the F switch 11. The number 042 was originally loaded into the 21 memory location in statement 190 and was thereafter accessed from the 21 location in statement 340. The * at the end of statement 770 causes a return to the next location after the previous "go-to" instruction. Since the last "go-to" statement was the semicolon at the end of statement 340, the next statement is 350.

In statement 350, a memory select of the contents of address 01 is performed. In statement 190, address 01 was loaded with nodal address 096. The nodal address 096 is therefore made available and the program jumps to the next address after 98G which is (99G in statement 780. Statement 790 is executed after statement 780.

In statement 790, the G switch is loaded with the node number 096 in the same manner that the F switch was loaded in statement 770. Statement 790 differs from statement 770 in that the "α" symbol is included before the G symbol. That "α" symbol indicates that any previous number loaded into the G switch remains loaded. Therefore multiple G poles are connected at any given time.

The * at the end of statement 790 causes the program to return to the point after the first semicolon in statement 350. After the first semicolon of statement 350, the contents of memory location 02, nodal address 112 from statement 190, are selected and then the program goes to (99E which is statement 740 followed by statement 750.

Statement 750 is executed to load the nodal address 112 into the E switch 10 of FIG. 1 in the same way that the F switch became loaded in statement 770. The * at the end of statement 750 returns the program to statement 360.

In statement 360, the stimulus is the M+ command which specifies that the G drive is a logic 1 and the E drive is a logic 0. Referring to FIG. 7, the conditions are that the node 096 will receive a logic 1 while the node 112 will receive a logic 0. The M+ command is interpreted by the control logic 219 to set up the E drive 222 and the G drive 223 to achieve these logic 1 and logic 0 outputs.

In statement 360, the program goes to (99H which is the subroutine at statement 800 followed by statement 810.

In statement 810, the limits of the output signal are specified to determine if they are within a 5.5 to 2.4 volt output range. The ampersand signifies to check the output and if it is within the output range, skip to the dollar sign. If the output is not within the range, then the program goes to (99Z of statement 840 and 850 and thereafter returns to the dollar sign in statement 810. Statement 860 is a subroutine for displaying the output pin and element number of the IC element which did not pass the test of statement 810. The IC number is selected and displayed from location 99 and the pin number is selected from memory location 00. Statement 850 also sets a 1 into the L register to signify that an error occurred. The 1 in the L register is thereafter available to identify that an error had occurred during the execution of the program. In statement 740, after $, the internal register field 91 is reset to 0 and the test limits for the high limit and the low limit register are both set to 9999. After the * in 810, return is made to statement 360 at the ";". The & indicates a jump to $ in 390 if an out of range condition occurred in (99H. The purpose of this jump is to avoid additional testing after the first error is detected by an out of range condition. Assuming no error occurred, statement 370 is next.

In statement 370, the M− stimulus is specified where G equals 0 and E equals 1. Again the 99H subroutine is performed with a return to the ampersand of statement 370. Again if no error has occurred, the jump is not made to statement 390 but statement 380 is next performed.

In statement 380, the E switch is set to the unused number 999 and the contents of memory location 02 are accessed from storage. In statement 190, storage location 02 was loaded with nodal address 112. In statement 380, that nodal address 112 is utilized in a jump to subroutine (99G. In (99G and statement 790, the node 112 is connected to the same level as node 096. At the end of statement 790, the * causes a return to statements 380 and 390.

In statement 390, the M+ stimulus is commanded so that the selected G poles are both logic 1. The logic 1 of the G poles are connected to both inputs of the 2-input NAND gate so that the NAND gate output, the F pole, should be a logic 0. The (98L field causes a transfer to low-limit test (99L of statements 820 and 830. Since both inputs of the NAND gate are high, the output should be low.

In statement 830, up to the ampersand the low limit is specified as between a range of 0.8 volts to 0.0 volts. The ampersand causes a check to see if the output is within the range. If not within the range, then the program goes to the display routine (99Z to display the error information. If no error is detected, then & causes a skip to $ and thereafter the lower limits are reset to 9999. The * at the end of statement 830 causes a return to the right of the semicolon in statement 390.

In statement 390, (98A* causes a return to the next location in 98A. Since the program was previously working from statement 190, the return from statement 390 is to statement 200.

In statement 200, a second one of the NAND gates in IC1 of FIG. 7 is tested. The one to be tested is the one with input pin numbers 4 and 5 and with output pin number 6. In statement 200, the output pin number 006 is loaded into the 00 address location of memory, the node number 112 is located into the 01 location of memory, the node number 083 is loaded into the 02 location of memory and the output node number 330 is loaded into 21 location of memory.

Thereafter, at the semicolon the end of statement 200 the program goes to subroutine (99A of statement 330 and the execution proceeds in the manner previously described for the processing of statement 190.

After the execution proceeds as previously described, the program returns to statement 210 where a third one of the NAND gates of IC1 of FIG. 7 is tested. In statement 210, the third NAND gate of IC1 is identified as having input pin numbers 9 and 10 and output pin number 8. The gate is tested in the same manner as the previous two NAND gates identified in statements 190 and 200.

In statement 220, the NAND gate having input pin numbers 12 and 13 and output pin number 11 is tested. Since that NAND gate is utilized as an inverter, it is not tested as a NAND gate since input pins 12 and 13 are always tied to the same logic level. In statement 220, memory location 00 is loaded with an output pin number 011. The F switch is loaded with a nodal input 312 and an M- stimulation is specified. The M- stimulation causes a logic 0 for the G input on node 312 so that the output of the gate should be high. A high limit test is performed by going to subroutine (99H which appears in statements 800 and 810. The (99H subroutine is executed in statement 810 in the same manner previously described. After (99H is performed (along with (99Z if required to display error information) return is made in statement 220 to the right of the first semicolon. If the high test indicated an error, the & causes a skip to $. If the high test indicated no error, then by executing to the right of & in statement 220, the stimulus is reversed through a M— command where the G pole is logic 1. The low test of subroutine (99L is performed with a return to $ in statement 220. At this point, the testing of IC1 is complete and the program now goes to statement 240 for the testing of IC2. IC2 is a quad NAND gate like IC1 and is tested in a manner similar to IC1.

IC2 differs from IC1 in connection with the testing of the NAND gate having input pins 9 and 10 and output pin 8 in IC2. The testing of this NAND gate differs because the 036 node corresponding to input pin number 10 is always connected to a fixed input level (+5 volts). For this reason, the 036 node cannot be stimulated with a logic 0 level. Hence statement 270 is modified to exclude any 0 level on node 036. At the completion of statement 280, statement 300 is at (98M. The % indicates a jump to the next location which is (99M in statement 400 and the program does not remember the point from which the jump originated.

D-TYPE FLIP-FLOP TEST

In statement 420, the program for testing D-type flip-flops like those of IC3 of FIG. 7 is identified.

In statement 440, the program is identified at (98A. The statement (04MW99003 causes the chip number, 003, to be written into the memory address 99.

In statement 460, the output pin number, 005, of the upper flip-flop of IC3 of FIG. 7 is written into memory address 00, the nodal address, 109, of the D input is written into memory location 01, the preset input node 116 is written into memory location 02; the clear input node 049 is written into memory location 03; the clock input nodal address, 062, is written into memory location 04, and the nodal address, 111, of the Q output is written into memory location 21. The number, 001, of the trigger line T1 is written into address location 80. The semicolon at the end of statement 460 causes the program to step to (99A in statement 520.

In statement 530, the G switch is set to be unused number 999, the E switch is set to the unused numer 999 and the contents of memory address 21 are selected. The contents of memory address 21 were loaded with 111 in statement 460. The program then goes to the next address after (98F which is (99F in statement 760.

In statement 770, the nodal address 111, accessed by MS command of statement 530, is extracted to load the F switch in the manner previously described in connection with loading the F switch for IC1.

The * at the end of statement 770 returns the program to statement 540.

In statement 540, the contents of the memory location 03 are accessed by the statement (04MS03. The 03 location of memory was loaded in statement 460 with the node number 049 which is, as shown in FIG. 7, the clear input to the upper flip-flop of IC3. In statement 540, the command (98E; causes the program to transfer to the utility routine identified in statement 740 and commencing in statement 750. In statement 750, the program utility routine loads the node number 049 into the E switch 10 of FIG. 1.

In statement 540 after the first ";", the command (04MS02 causes the contents of memory location 02 to be selected. In statement 460, the 02 contents of the memory were loaded with the node number 116 which is the preset node of both the flip-flops of IC3 in FIG. 7. In statement 540, the command (98G; causes the program to transfer to statement 780 followed by statement 790. In statement 790, the node number 116 is loaded into the G switch and the program returns to statement 550.

In statement 550, the command (04M- causes the E switch to be driven by a logical 1 drive signal and the G switch to be driven by a logical 0 drive signal. The G switch 0 presets the Q output of the upper flip-flop to a logical 1 in normal, error-free operation. To test for a logical 1, the command (98H; causes the program to transfer to statement 800 and thereafter to statement 810 to perform a high test in the manner previously described.

If a logical 1 is detected by the high test of statement 810, the & of statement 550 is ignored and the program goes to statement 560. If a logical 1 is not detected by the high test, then the & of statement 550 causes the program to transfer to the $ in statement 630 to avoid further testing after an error condition is detected.

Assuming no error condition is detected by the high test, the program, after completing statement 810, returns to statement 560. In statement 560, the command (04M+ causes the E switch to be a logical 0 and the G switch to be a logical 1. Accordingly, the upper flip-flop of IC3 receives a 0 on its clear input (node 049) and a 1 on its preset input (node 116). Under this operation, the D-type flip-flop in normal, error-free operation is reset causing ist Q output (node 111) to go to logical 0.

In statement 560, the command (98L; causes the program to transfer to the low test of statements 820 and 830. The low test of statement 830 is performed to determine if the Q output of the flip-flop is a logical 0. The * at the end of statement 830 causes the program to return to the & of statement 560. If no error was detected by the low test, then the & of statement 560 causes the program to go to statement 580. If error was detected by the low test, then the program goes directly to the $ sign in statement 630 to avoid any further testing of the component. Assuming that the low test did not detect an error, statement 580 is performed.

In statement 580, the (04E999 command causes the E switch to be cleared to the unused number 999. Next, the MS01(98G; command causes the contents of memory location 01 to be loaded into the G switch by performing the statement 790 utility routine. Memory location 01 was loaded in statement 460 with the D-input node number 109. In statement 580, after the first ";", the command (04MS03; causes the contents of memory location 03 to be loaded into the G switch. The 03 location of memory was loaded with the clear input node number 049 in statement 460. After completion of the statement 580, the D-input node 109, the clear input node 049 and the preset input node 116 are all connected in common to the G switch.

In statement 590, the command (04MS80 accesses the contents of memory location 80. The contents of memory location 80 were stored in statement 460 and 001.

In statement 590, the T+ sign command signifies that one or more positive-going trigger pulses are to be generated. The command (90 is an extraction command. The field 0001 specifies that the 1 from the right-most bit from memory location 80 are to be selected. The right-most bit of memory location 80, as indicated in statement 460, is the digit 1. The 1 specifies that the first one of the trigger lines from switch 304 of FIG. 1 (the T1 connection to node 062 of FIG. 7) is to recieve the positive-going trigger pulse.

In statement 590, the 01 at the end signifies the number of trigger pulses which, in the present example, is 1.

In statement 600, the command (04M+ signifies that the G switch is to receive a logical 1 and the E switch is to receive a logical 0. Referring to FIG. 7, the M+ command causes the D-input on node 109, the clear input on node line 102 and the preset input on node line 049 all to receive logical 1. Thereafter, a positive-going clock pulse appears on the T1 input of node line 062 thereby clocking the flip-flop. Under error-free conditions, the Q output of the flip-flop is switched to a logical 1. In statement 600, the command (98H causes a transfer to the utility routine in statement 810 which tests to determine if the logical 1 is present on the Q output. If the Q output is not a logical 1, then the & at the end of statement 600, causes the program to transfer to $ in statement 630. Assuming that a logical 1 was detected in statement 600, the program goes to statement 620.

In statement 620, the command (04G999 causes all of the G switch connections to be cleared to the unused number 999. The MS01 command selects the contents of memory location 01. Memory location 01 was loaded with the D-input node number 109 in statement 460. The 109 number is loaded into the E switch by the E switch utility routine which is reached by the command (98E;.

In statement 620 after the first ";", the command (04MS03(98G; causes the contents of memory location 03 to be loaded into the G switch. The memory location 03 contents were loaded in statement 460 as the clear node 049.

After the second ";" in statement 620, the command (04MS02; causes the contents of memory location 02 to be loaded to enable a second one of the G switches. In statement 460, the 02 location of memory was loaded with the preset node number 116.

In statement 630, the command (04M+ causes the G switches to receive a logical 1 and the E switch to receive a logical 0. Under these conditions, the D-input receives a logical 0 while the clear and preset inputs receive a logical 1. Thereafter, when a positive-going trigger pulse is applied, the flip-flop, under error-free operation, is clocked to provide a 0 on the Q output. In statement 630, the (98L command causes the Q output node 111 to be tested to detect whether or not the logical 0 is present. The low test is performed in accordance with the utility routine of statements 820 and 830. The * at the end of the statement 830 returns the program to $ in statement 630. The program then commences to the command (98A* which causes the program to return to the next unexecuted location after (99A of statement 440. The next unexecuted location is statement 470.

Statement 470 contains the new information necessary to test the lower flip-flop of IC3 in FIG. 7. In statement 470, the command 04MW causes the output pin number of the lower flip-flop, that is pin number 009 to be written into memory location 00; causes the D-input node number 102 to be written into the memory location 01 and causes the output node number 219 to be written into memory location 21. The present node number 116 remains as previously written in memory location 02, the clear node number 049 remains as previously written in memory location 03, the clock node 062 remains as previously written in memory location 04, and the clock trigger line 001 remains written in location 80.

The ";" at the end of statement 470 causes the program to go to (99A in statement 520 and to execute the sub-routine package from statements 520 through statement 630 for the lower flip-flop of IC3 in the manner previously described in connection with the upper flip-flop of IC3. When these statements have been executed and the lower flip-flop has been tested, the * at the end of statement 630 returns to the next unexecuted location under (99A of the flip-flop program starting at statement 440. The next location is in statement 490 which is the command (98M%. The (98M% causes the program to jump to (99M in Statement 650.

In statements 680 and 690 information is presented for display.

In statement 700, the field (970 causes the vacuum to drop to release the bed-of-nails fixture which is included in the node connect 14. The XX field clears the X switch 302 to remove the power connection, the B field clears all other stores, the E, F and G switches are set to the unused 999 numbers and the L register is set to 0. At the end of statement 700, the program goes to the next location after (98W which is (99W in statement 130.

At statement 130, the program has returned to the beginning statement. A new circuit under test may be inserted for a new test or the old circuit under test can be retested.

Pulse Testing

The present invention employs pulse testing of logical components in a circuit under test. The amplitude, duration, and frequency of the pulses which form the drive signals are sufficient to drive the components under test to a predetermined logic state while not damaging any of the components in the circuit under test. Referring to FIG. 7 and IC1, the NAND gate 341 having the input pins 9 (node 042) and 10 (node 330) and having the output pin 8 (node 109) is tested by applying pulses to the nodes 042 and 330 and detecting the output level on node 109. A potential problem exists in that Node 042 also connects to the output pin 3 of NAND gate 340 of IC1. The application of a drive signal to node 042 of IC1 therefore applies current into the input pin 9 of NAND gate 341 and also into the output pin 3 of NAND gate 340. The characteristics of the drive signal applied to node 042 must be such that they do not exceed the allowable voltage, current and power ratings of each of the connected components.

When the components under test are logic devices such as the NAND gates of IC1, the voltage levels are typically between 0 and Vcc where Vcc in the present example is +5 volts. Accordingly, the maximum voltage applied to node 042 is approximately Vcc as controlled by the drivers of FIG. 6.

Referring to FIG. 6, the common drive circuit 354 provides an output signal through the resistor 357 to the drive line 361 in connection with the T driver 325. Drive circuit 354 is repeated in each of the other drivers of FIG. 6. The voltage level on output line 361 (or any of the other output lines 362, 363 or 364) is switched between ground and Vcc in the low impedance state. Accordingly, the voltage which will be applied to the node 042 in FIG. 7 will not exceed the Vcc rated value. The output resistor 357 in FIG. 6 is approximately 1 ohm so that the overall output impedance on line 361 is approximately 10 ohms or less. The low output impedance is present when either the transistor T2 or the transistor T3 is turned on. When both transistors T2 and T3 are turned off, then the output impedance on line 361 is very high. In a typical embodiment useful for well-known T$^2$L circuitry, the drive circuit 354 is of the type to deliver approximately 700 milliamps of current. In usual operation only 60 or 70 milliamps are actually delivered to the circuit under test.

In addition to the voltage and current characteristics of the drive circuit of FIG. 6, a critical factor in insuring that the drive signal does not damage the circuit under test is the duration of the applied pulses. The duration of the drive signals on each of the drive lines 361 through 364 is under control of the LOGIC DRIVE signal in FIG. 6 as derived from FIG. 4.

In FIG. 4, the LOGIC DRIVE signal is the buffered output (through inverting buffers 337 and 338) of AND gate 291. As shown in FIG. 7, the LOGIC DRIVE signal is a logical 1 from the time that the line 279Q* from the one-shot 279 is 1 and the line 282' is reset. The duration of the LOGIC DRIVE signal from t1 until t26 is selected to be a short duration of time so that the average power delivered to the circuit under test will be small and non-damaging. For typical integrated circuit of the T²L type, a duration of less than approximately 30 microseconds every 1.5 milliseconds does not cause damage. In the particular embodiment described in FIG. 8, the duration of the LOGIC DRIVE signal from t1 until t26 is approximately 12 microseconds. The duration of the LOGIC DRIVE signal is variable as a function of the number of trigger pulses on line 296'. The duration from t1 until t7 is approximately 3 microseconds and the duration from t14 until t26 is approximately 5 microseconds. The duration from t7 until t14 in FIG. 8 is approximately 4 microseconds in the example shown. That duration from t7 to t14, however, varies as a function of the number of trigger pulses on line 296'. The number of trigger pulses may vary, in the present example, from 0 to 19. Therefore, the LOGIC DRIVE signal, in the present example, may vary between 8 and 27 microseconds as the number of trigger pulses varies between 0 and 19.

Since the present invention performs testing under control of a program processor, it is possible that the MEAS TRIG signal which initiates a test will be generated so frequently that the average power delivered by the drive signals to the connected nodes will exceed the permitted power delivery to the components connected to the node receiving the drive signal. In order to insure that the LOGIC DRIVE signal is not repetitively generated so as to cause excessive average power, the delay between time t0 and time t1 is selected to be no less than some predetermined long time. For example, in the present invention, a period of 1.5 milliseconds is selected. The 1.5 milliseconds is determined by the one-shot 270 in FIG. 4 in combination with the minimum processing delay achievable by the processing system. In the particular example, the minimum processing delay of the system is 0.7 milliseconds so that the delay of the one-shot 279 in FIG. 4 is selected as 0.8 milliseconds for a total of 1.5 milliseconds. With these values selected, the maximum duration of the LOGIC DRIVE signal is 30 microseconds in a time period of approximately every 1.5 milliseconds. Accordingly, the duty cycle during which power can be delivered is approximately $(30 \times 10^{-6})/(1.5 \times 10^{-3})$ or 2% of the time. The delay means including the one-shot 279, insures that the average power of the drive signal delivered to any node in the circuit under test is less than the average power capability of the components receiving the drive signal.

Topology Independence

The program of CHART I includes subroutines correlated to specific types of components under test. For example, the subroutine package for the 2-input positive NAND gates is included in statements 310 through 400. That subroutine package is executed to test the NAND gate in IC1 and IC2 in a manner which is independent of the cross-connection of inputs and outputs of the gates (that is, the topology of the gates) in the circuit under test. The subroutine package is executed independent of the cross-connection of the gates in the circuit since the subroutine package only accesses information from fixed locations in translation memory 301 of FIG. 1. Any number of NAND gates (or other logic components) may be tested in this manner. In this specification, "logic element" refers to gates, flip-flops, counters and all other similar elements which receive digital inputs to produce digital outputs.

In FIG. 7, each of the eight NAND gates of Ic1 and of IC2 is a logic element and each of the flip-flops of IC3 is a logic element. The four NAND gates of IC1, the four NAND gates of IC2, and the two flip-flops of IC3 form, respectively, three different integrated circuit components.

In the program of CHART I, the appropriate information is loaded into memory 301 under the 2 INPUT POS NAND portion of the program from statements 150 through 280.

In a similar manner, the subroutine package for the D-type, flip-flop is included in statements 500 through 630 of CHART I. These subroutines again access only the memory 301 and hence are applicable to any number of flip-flops like those shown in IC3 of FIG. 7. The information required for the flip-flop subroutines is loaded into translation store 301 in the statements from 420 through 470 of CHART I.

The use of a translation store like memory 301 for translating nodal and pin addresses into a topology independent format substantially reduces the number of programming steps which are required in the testing of a circuit under test.

Also, since the drive signals are selected with controlled, non-damaging voltage, current and power limits, they may be applied throughout the circuit under test generally on a topology independent basis.

While the invention has been particularly shown and described with reference to preferred embodiments thereof it will be understood by those skilled in the art that various changes in form and details may be made therein without departing from the spirit and scope of the invention.

What is claimed is:

1. A testing apparatus for testing electrical properties of logic elements having inputs and outputs in a circuit under test where the circuit is formed by a plurality of the logic elements interconnected at nodes comprising,
    selectible connection switch means for connection to selected nodes of the circuit under test, said switch means including first switch means for connecting to first ones of said nodes and thereby for connecting to all inputs of a selected logic element under test, and said switch means including second switch means for connecting to a second one of said nodes and thereby for connecting to an output of the selected logic element under test,
    drive means for providing one or more drive signals to said first ones of said nodes of said selected logic element under test,
    measurement means connected to said second one of said nodes to receive an output signal from the selected logic element under test, control means including program controlled processor means for processing a program of instructions correlated to predetermined types of logic elements, said processor means operative to cause said switch means to be connected to said first and second ones of said nodes and to cause said drive means to provide said drive signals to said selected logic element under test in accordance with a subroutine of instructions correlated to said selected logic element under test, translation memory means for storing node numbers identifying nodes including means for accessing said memory means to fetch node numbers identifying said first and second nodes in response to said processor means during the execution of said subroutine whereby said subroutine is executed independently of the topology of the selected logic element in the circuit under test.

2. The apparatus of claim 1 wherein said drive means includes control means for controlling said drive means to provide said drive signals for a duration sufficient to cause said selected logic element under test to form said output signal with a predetermined logic level but for a duration insufficient to cause damage to other logic elements in the circuit under test.

3. The apparatus of claim 1 wherein said connection switch means includes connection switch control means for controlling, under control of said processor means, the connection to said selected nodes of the circuit under test.

4. The apparatus of claim 1 wherein said first switch means of said connection switch means includes,
a first switch for connecting a first one of said drive signals from said drive means to said selected logic element under test, and
a second switch for connecting a second one of said drive signals from said drive means to said selected logic element under test.

5. The apparatus of claim 4 wherein said drive means includes means to provide said first one of said drive signals as a logical 1 and includes means to provide said second one of said drive signals as a logical 0.

6. The apparatus of claim 4 wherein said connection switch means includes a power switch connectable for providing reference power to the circuit under test continuously during the testing of a plurality of components in the circuit under test.

7. The apparatus of claim 4 wherein said first switch means includes a third switch for connecting an initialization signal from said drive means to said selected logic element under test and wherein said control means includes means for controlling said drive means to provide said initialization signal as an initial one of said drive signals.

8. The apparatus of claim 4 wherein said first switch means includes a switch for connecting clock pulses from said drive means to said selected logic element under test and wherein said control means includes means for controlling said drive means to provide one or more clock pulses to said selected logic element under test.

9. The apparatus of claim 2 wherein said circuit under test includes N nodes, wherein said first and second switch means each includes a switch having N lines connected to said N nodes, and wherein said first and second switch means each includes means for selecting one of said N lines.

10. The apparatus of claim 9 wherein said first switch means includes a switch for selecting M of said N lines in common where M is any integer less than N.

11. The apparatus of claim 1 wherein said memory means includes a random access store for storing said node numbers, an address store for storing an address specifying a location in said random access store, and control means for loading said address store in response to said processor means.

12. A testing apparatus for testing electrical properties of a circuit under test where the circuit is formed by a plurality of components, each having one or more logic elements, interconnected at nodes comprising:
a plurality of selectable connection switches having switch outputs for connection to selected nodes of the circuit under test,
connection switch controller means for controlling said connection switches to connect said switch outputs to selected nodes where the selected nodes are connected to a selected logic element,
drive means providing drive signals through said connection switches for driving selected ones of said nodes to predetermined logic states and thereby to provide said drive signals as inputs to said selected logic element in the circuit under test,
control means for controlling said drive means to provide said drive signals for a duration sufficient to cause said selected logic element to form an output signal having a predetermined logic level and insufficient to cause damage to other logic elements in the circuit under test,
measurement means connected by said connection switches to receive said output signal for measuring electrical properties of the output signal,
program controlled processor means for processing a program of instructions including subroutines of instructions correlated to predetermined types of logic elements in said circuit under test, said processor means connected to said connection switch controller to cause said switch outputs to be connected to said selected nodes, and said processor means connected to said control means for controlling said drive means connected to said selected logic element in accordance with a correlated subroutine of instructions,
memory means for storing node numbers identifying nodes of said selected logic element of the circuit under test and including means for accessing said memory means in response to said processor means during the execution of said subroutines.

13. The apparatus of claim 12 wherein said memory means includes a random access store for storing said node numbers, an address store for storing an address specifying a location in said random access store, and control means for loading said address store in response to said processor means.

14. The apparatus of claim 12 wherein said connection switches include,
a first switch for selecting first ones of said selected nodes for providing a first drive signal to said selected logic element from said drive means,
a second switch for selecting second ones of said selected nodes for providing a first drive signal to said selected logic element from said drive means,
a third switch for selecting a third one of said selected nodes as an output from said selected logic element.

15. The apparatus of claim 14 wherein said drive means includes means to provide said first drive signal as a logical 1 and includes means to provide said second drive signal as a logical 0.

16. The apparatus of claim 14 wherein said connection switches include power switch means for providing reference power to the circuit under test.

17. The apparatus of claim 14 including a fourth switch for connecting an initialization signal from said drive means to fourth selected ones of said nodes and wherein said control means includes means for providing said initialization signal prior to said drive signals.

18. The apparatus of claim 17 including a fifth switch for connecting said drive means to fifth selected ones of said nodes and wherein said control means includes means for providing one or more clock pulses as drive signals to said fifth selected ones of said nodes.

19. The apparatus of claim 14 wherein said circuit under test is formed by said components interconnected on a printed circuit board and wherein said connection switches are connected to said nodes on said circuit board by a bed-of-nails fixture.

20. A testing apparatus for testing electrical properties of a circuit under test where the circuit is formed by a plurality of components, each having one or more logic elements, interconnected at nodes on a printed circuit board comprising:

a plurality of selectable connection switches having switch inputs and outputs where the inputs are selectively connected to the outputs under program control, fixture means for connecting said switch outputs to said nodes on the printed circuit board, connection switch controller means for controlling under program control said connection switches to connect said switch inputs to selected switch outputs whereby said inputs are connected to selected nodes of a selected logic element, drive means, connected to said switch inputs, for providing drive signals through said connection switches for driving selected ones of said nodes to predetermined logic states and thereby to provide said drive signals as inputs to said selected logic element in the circuit under test, control means for controlling, under program control, said drive means to provide said drive signals for a conducting duration sufficient to cause said selected logic element to form an output signal having a predetermined logic level and insufficient to cause damage to any logic elements in the circuit under test, measurement means connected by said connection switches to receive said output signal for measuring electrical properties of the output signal, program controlled processor means for processing a program of instructions including subroutines of instructions correlated to predetermined types of components in said circuit under test, said processor means connected to said connection switch controller to cause said switch inputs to be connected to said switch outputs, and said processor means connected to said control means for controlling said drive means connected to said selected logic element in accordance with a correlated subroutine of instructions, memory means for storing node numbers identifying nodes of said selected logic element of the circuit under test, said memory means including a random access store for storing said node numbers, an address store for storing an address specifying a location in said random access store, and control means for loading said address store under program control in response to said processor means.

21. The apparatus of claim 20 wherein said control means includes delay means for controlling the ratio of the conducting duration and the nonconducting duration of said drive signals and thereby to control average power of said drive signals.

22. The apparatus of claim 21 wherein said delay means has a delay whereby said ratio of the conducting duration to the nonconducting duration is not greater than approximately 2%.

23. The apparatus of claim 20 wherein said control means includes control logic comprising, a decoder for decoding instructions from said processor means to provide control signals, and a plurality of stores for storing control states in response to said control signals, and wherein said control means includes timing control means comprising, a clock for providing clock pulses and a plurality of counters for counting clock pulses under control of said processor means to control the sequential generation of said drive signals.

* * * * *